(12) United States Patent
Jakobsson et al.

(10) Patent No.: US 10,033,019 B2
(45) Date of Patent: Jul. 24, 2018

(54) ORGANIC LIGHT-EMITTING COMPOSITION, DEVICE AND METHOD

(71) Applicants: Cambridge Display Technology, Cambridgeshire (GB); Sumitomo Chemical Company Limited, Tokyo (JP)

(72) Inventors: Fredrik Jakobsson, Cambridge (GB); Christian Nielsen, London (GB); Jonathan Pillow, Stotfold (GB); Francesco Distasio, Genoa (IT); Edward Snedden, Newton-Le-Willows (GB)

(73) Assignees: Cambridge Display Technology Limited, Cambridgeshire (GB); Sumitomo Chemical Company Limited, Tokyo (JP)

( * ) Notice: Subject to any disclaimer, the term of this patent is extended or adjusted under 35 U.S.C. 154(b) by 878 days.

(21) Appl. No.: 14/091,212

(22) Filed: Nov. 26, 2013

(65) Prior Publication Data

US 2014/0183469 A1    Jul. 3, 2014

(30) Foreign Application Priority Data

Nov. 30, 2012 (GB) .................................. 1221623.0

(51) Int. Cl.
   *H01L 51/00* (2006.01)
   *H01L 51/50* (2006.01)
   (Continued)

(52) U.S. Cl.
   CPC .............. *H01L 51/56* (2013.01); *C08G 61/02* (2013.01); *C08L 65/00* (2013.01); *C09K 11/06* (2013.01);
   (Continued)

(58) Field of Classification Search
   None
   See application file for complete search history.

(56) References Cited

U.S. PATENT DOCUMENTS

| | | | |
|---|---|---|---|
| 6,949,291 B2 * | 9/2005 | Holmes | C07D 223/18 |
| | | | 428/411.1 |
| 2004/0067388 A1 | 4/2004 | Suzuki | |
| 2007/0145886 A1 * | 6/2007 | Aziz | H01L 51/52 |
| | | | 313/504 |

FOREIGN PATENT DOCUMENTS

| GB | 2395198 A | 5/2004 |
|---|---|---|
| WO | WO 02/26856 A1 | 4/2002 |

(Continued)

OTHER PUBLICATIONS

Zhao et al., Triplet-triplet annihilation based upconversion: from triplet sensitizers and triplet acceptors to upconversion quantum yields, RSC Adv., 2011, 1, 937-950.*

(Continued)

*Primary Examiner* — Francisco W Tschen
(74) *Attorney, Agent, or Firm* — Wolf, Greenfield & Sacks, P.C.

(57) ABSTRACT

A light-emitting composition comprising a mixture of a fluorescent light-emitting material a triplet-accepting copo- (Continued)

lymer comprising a triplet-accepting repeat unit and a repeat unit of formula (I):

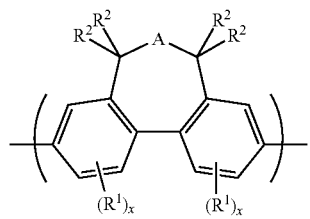

wherein A is a divalent group; $R^1$ independently in each occurrence is a substituent; $R^2$ in each occurrence is H or a substituent; and x independently in each occurrence is 0, 1, 2 or 3.

16 Claims, 3 Drawing Sheets

(51) Int. Cl.
    *H01L 51/56*     (2006.01)
    *C09K 11/06*     (2006.01)
    *H05B 33/14*     (2006.01)
    *C08G 61/02*     (2006.01)
    *C08L 65/00*     (2006.01)
(52) U.S. Cl.
    CPC ...... *H01L 51/0039* (2013.01); *H01L 51/0043* (2013.01); *H01L 51/5012* (2013.01); *H05B 33/14* (2013.01); *C08G 2261/124* (2013.01); *C08G 2261/1412* (2013.01); *C08G 2261/314* (2013.01); *C08G 2261/3142* (2013.01); *C08G 2261/342* (2013.01); *C08G 2261/411* (2013.01); *C08G 2261/5242* (2013.01); *C08G 2261/95* (2013.01); *C08L 2205/02* (2013.01); *C09K 2211/1416* (2013.01); *C09K 2211/1433* (2013.01)

(56)     References Cited

FOREIGN PATENT DOCUMENTS

| WO | WO 2006/064194 A1 | 6/2006 | |
|---|---|---|---|
| WO | WO 2011/161424 A1 | 12/2011 | |
| WO | WO 2011161425 A1 * | 12/2011 | ........... C07C 13/567 |
| WO | WO 2012/049462 A1 | 4/2012 | |

OTHER PUBLICATIONS

Lim et al., "Suppression of green emission in a new class of blue-emitting polyfluorene copolymers with twisted biphenyl moieties", Adv. Funct. mater., 2005, 25, pp. 981-988.

Wang et al., "Theoretical studies of the absorption and emission properties of the fluorene-based conjugated polymers", Macromolecules, 2004, 37, pp. 3451-3458.

Compied Search and Examination Report for corresponding patent application No. GB1221623.0.

[No Author Listed] Mixture. A Dictionary of Science: Fifth Edition. Oxford University Press. 2005:530-1.

[No Author Listed] Mixture. Wikipedia, the Free Encyclopedia. https://en.wikipedia.org/wiki/Mixture#cite_note-3 [last edited Jun. 23, 2017].

* cited by examiner

ORGANIC LIGHT-EMITTING COMPOSITION, DEVICE AND METHOD

RELATED APPLICATIONS

This application claims Foreign priority benefits under 35 U.S.C. § 119(a)-(d) or 35 U.S.C. § 365(b) of British application number 1221623.0, filed Nov. 30, 2012, the entirety of which is incorporated herein.

BACKGROUND OF THE INVENTION

Electronic devices comprising active organic materials are attracting increasing attention for use in devices such as organic light emitting diodes, organic photovoltaic devices, organic photosensors, organic transistors and memory array devices. Devices comprising organic materials offer benefits such as low weight, low power consumption and flexibility. Moreover, use of soluble organic materials allows use of solution processing in device manufacture, for example inkjet printing or spin-coating.

A typical organic light-emissive device ("OLED") is fabricated on a glass or plastic substrate coated with a transparent anode such as indium-tin-oxide ("ITO"). A layer of a thin film of at least one electroluminescent organic material is provided over the first electrode. Finally, a cathode is provided over the layer of electroluminescent organic material. Charge transporting, charge injecting or charge blocking layers may be provided between the anode and the electroluminescent layer and/or between the cathode and the electroluminescent layer.

In operation, holes are injected into the device through the anode and electrons are injected into the device through the cathode. The holes and electrons combine in the organic electroluminescent layer to form an excitons which then undergo radiative decay to give light.

In WO90/13148 the organic light-emissive material is a conjugated polymer such as poly(phenylenevinylene). In U.S. Pat. No. 4,539,507 the organic light-emissive material is of the class known as small molecule materials, such as tris-(8-hydroxyquinoline) aluminium ("Alq$_3$"). These materials electroluminesce by radiative decay of singlet excitons (fluorescence) however spin statistics dictate that up to 75% of excitons are triplet excitons which undergo non-radiative decay, i.e. quantum efficiency may be as low as 25% for fluorescent OLEDs-see, for example, Chem. Phys. Lett., 1993, 210, 61, Nature (London), 2001, 409, 494, Synth. Met., 2002, 125, 55 and references therein.

It has been postulated that the presence of triplet excitons, which may have relatively long-lived triplet excited states, can be detrimental to OLED performance as a result of triplet-triplet or triplet-singlet interactions.

WO 2005/043640 discloses that blending a perylene derivative with an organic light-emissive material in an organic light-emissive device can give a small increase in the lifetime of the device. However, while higher concentrations of perylene derivative give greater improvements in lifetime this results in a significant red-shift in the emission spectrum.

US 2007/145886 discloses an OLED comprising a triplet-quenching material to prevent or reduce triplet-triplet or triplet-singlet interactions.

U.S. Pat. No. 6,949,291 discloses light-emitting polymers having repeat units of formula (I):

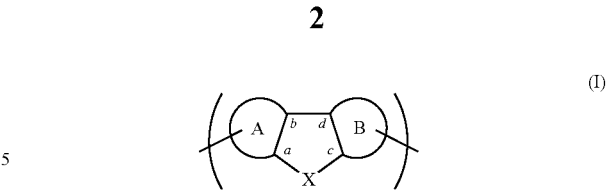

wherein A and B are the same or different and each comprises wholly or partially an aryl moiety or a heteroaryl moiety, said moiety in A being fused to the bond a-b and said moiety in B being fused to the bond c-d; and X is a linking unit, X being such that there is a torsion angle of at least 5° between the bond a-b and the bond c-d about the bond b-d.

WO 2012/086670 and WO 2012/086671 disclose a composition of a light-emitting material and certain polymers.

US 2005/095456 discloses an OLED having a light-emitting layer comprising a host material, a dye or pigment and an additive exhibiting an absorption edge of which energy level is higher than that of an absorption edge of the dye or the pigment

SUMMARY OF THE INVENTION

In a first aspect the invention provides a light-emitting composition comprising a mixture of a fluorescent light-emitting material a triplet-accepting copolymer comprising a triplet-accepting repeat unit and a repeat unit of formula (I):

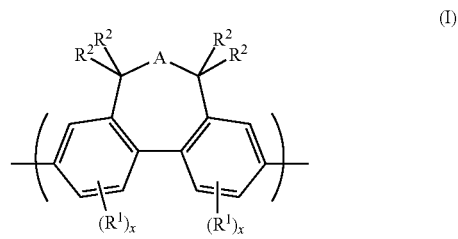

wherein A is a divalent group; $R^1$ independently in each occurrence is a substituent; $R^2$ in each occurrence is H or a substituent; and x independently in each occurrence is 0, 1, 2 or 3.

In a second aspect the invention provides a formulation comprising a composition according the first aspect and at least one solvent.

In a third aspect the invention provides an organic light-emitting device comprising an anode, a cathode and a light-emitting layer between the anode and the cathode wherein the light-emitting layer comprises a composition according to the first aspect.

In a fourth aspect the invention provides a method of forming an organic light-emitting device according to the third aspect, the method comprising the steps of forming the light-emitting layer over one of the anode and cathode, and forming the other the anode and cathode over the light-emitting layer.

DETAILED DESCRIPTION OF THE INVENTION

Figure 1:
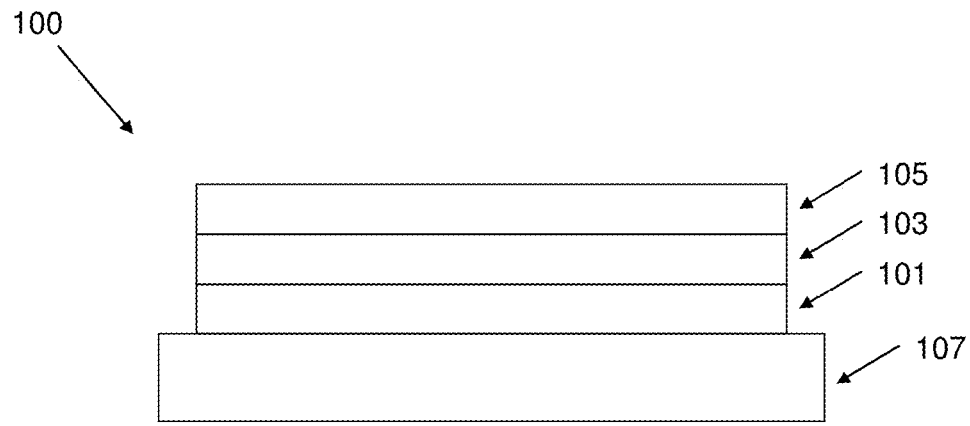
FIG. 1 illustrates an organic light-emitting device according to an embodiment of the invention.

FIG. 1 illustrates an OLED according to an embodiment of the invention.

The OLED 100 comprises an anode 101, a cathode 105 and a fluorescent light-emitting layer 103 between the anode and the cathode. The device is supported on a substrate 107, for example glass or plastic.

One or more further layers may be provided between the anode 101 and cathode 105, for example hole-transporting layers, electron transporting layers, hole blocking layers and electron blocking layers. The device may contain more than one light-emitting layer.

Exemplary Device Structures Include:
Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

Preferably, at least one of a hole-transporting layer and hole injection layer is present.

Preferably, both a hole injection layer and hole-transporting layer are present.

Light-emitting materials include red, green and blue light-emitting materials.

A blue emitting material may have a photoluminescent spectrum with a peak in the range of 400-490 nm, optionally 420-490 nm.

A green emitting material may have a photoluminescent spectrum with a peak in the range of more than 490 nm up to 580 nm, optionally more than 490 nm up to 540 nm.

A red emitting material may optionally have a peak in its photoluminescent spectrum of more than 580 nm up to 630 nm, optionally 585-625 nm.

The fluorescent light-emitting layer 103 contains a mixture of a fluorescent light-emitting material and a triplet-accepting polymer. Light-emitting layer 103 may consist of the light-emitting polymer and the triplet accepting polymer alone, or may comprise these materials in combination with one or more further materials, for example hole and/or electron transporting materials In operation, holes and electrons are injected into the device to form singlet and triplet excitons. Singlet excitons on the fluorescent light-emitting material may undergo radiative decay to produce fluorescence. Triplet excitons may be formed on or transferred to the triplet-accepting polymer and removed by either non-radiative triplet exciton quenching or by delayed fluorescence arising from triplet-triplet annihilation.

Each of these mechanisms is described below in turn.

Triplet Quenching

Figure 2:
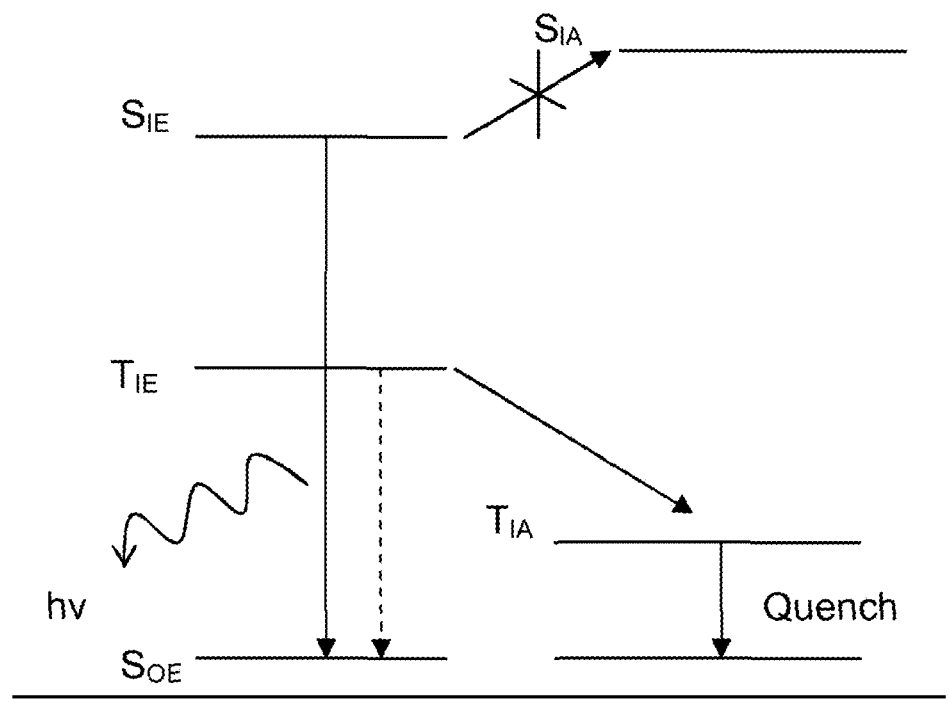
FIG. 2 is a schematic illustration of triplet quenching.

FIG. 2 illustrates a first energy transfer mechanism for an exemplary OLED. For the avoidance of any doubt energy level diagrams herein, including FIG. 2, are not drawn to any scale.

FIG. 2 illustrates energy transfer for an OLED provided with a light emitting material having a singlet excited state energy level $S_{1E}$ and a singlet ground state energy level $S_{0E}$. Singlet excitons having energy $S_{1E}$ decay by emission of fluorescent light hv, illustrated by the solid arrow between $S_{1E}$ and $S_{0E}$ in FIG. 1. Triplet-triplet exciton interactions or triplet-singlet exciton interactions may create "super-excited" states on the light-emitting material. Without wishing to be bound by any theory, it is believed that formation of these highly energetic "super-excited" states on the light emitting material may be detrimental to operational lifetime of the device. However, by providing a triplet-accepting polymer comprising a repeat unit of formula (I), the polymer having an excited triplet state energy level $T_{1A}$ that is lower than $T_{1E}$, it is possible for triplet excitons to be transferred for quenching to the triplet accepting polymer, the alternative of radiative decay from $T_{1E}$ to $S_{0E}$, illustrated by a dotted line in FIG. 1, being a spin-forbidden process.

$S_1$ and $T_1$ levels of a material can be measured from its fluorescence and gated low-temperature phosphorescence spectra respectively.

The triplet accepting polymer has a lowest singlet excited state energy level $S_{1A}$ that is higher than the lowest singlet excited state energy level $S_{1E}$ in order to substantially or completely prevent transfer of singlet excitons from $S_{1E}$ to $S_{1A}$. Preferably, $S_{1A}$ is at least kT higher in energy than $S_{1E}$ in order to prevent any substantial back-transfer of excitons and fluorescence from the triplet-accepting polymer. Likewise, $T_{1E}$ is preferably at least kT higher in energy than $T_{1A}$. Although it may be preferable for energy level $S_{1A}$ to be greater than $S_{1E}$, it will be appreciated that this is not essential in order for triplet absorption to occur. Some light emission from the triplet-accepting polymer may be observed. Optionally, light emitted from the composition has a peak wavelength that is the same as or no more than 10 nm longer than the peak wavelength of light emitted from the fluorescent emitter alone.

Triplet-Triplet Annihilation

Figure 3:
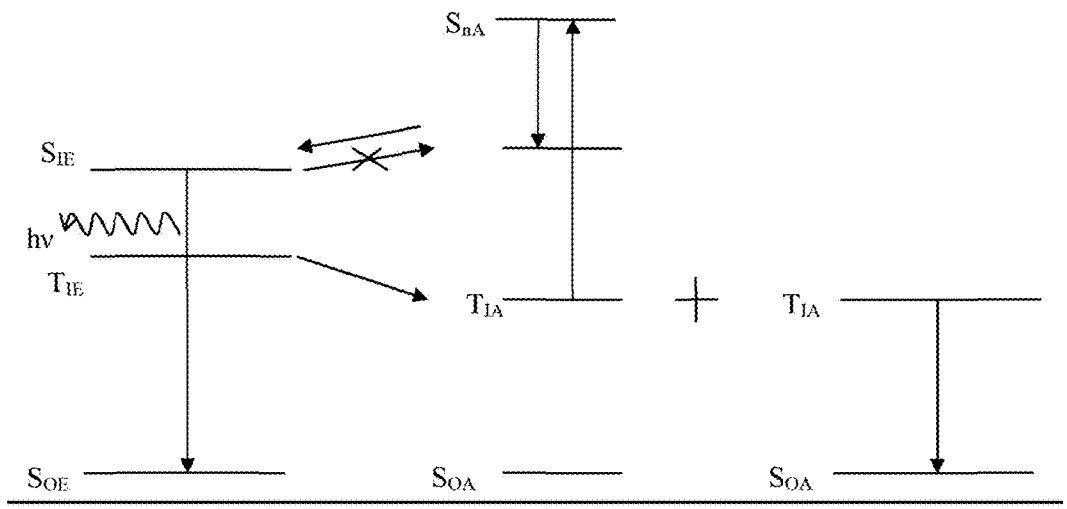
FIG. 3 is a schematic illustration of a first triplet-triplet annihilation mechanism.

FIG. 3 illustrates a second energy transfer mechanism for an exemplary OLED.

According to this embodiment, triplet-triplet annihilation (TTA), caused by an interaction between two triplet-accepting units, results in a triplet-triplet annihilated singlet exciton having an energy of up to $2 \times T_{1A}$, wherein $T_{1A}$ represents the triplet excited state energy level of the triplet-accepting polymer. This singlet exciton, formed on a first of the two triplet-accepting units, has energy level $S_{nA}$ that is higher in energy than $S_{1A}$ and $S_{1E}$ and so it may transfer to $S_{1A}$ and then to $S_{1E}$ from which light hv may be emitted as delayed fluorescence. The triplet exciton on the second of the two triplet-accepting units may decay to the ground state $T_{0A}$.

Initially, the triplet exciton formed at $T_{1E}$ is transferred to $T_{1A}$. By providing a triplet-accepting polymer having energy level $T_{1A}$ that is lower than $T_{1E}$, rapid transfer of excitons from $T_{1E}$ to $T_{1A}$ may occur. This transfer is relatively rapid compared to the rate of decay of triplet excitons from $T_{1E}$ to $S_{0E}$, illustrated by a dotted arrow in FIG. 1, which is a spin-forbidden process. The energy gap between $T_{1E}$ and $T_{1A}$ is preferably greater than kT in order to avoid back-transfer of excitons from $T_{1A}$ to $T_{1E}$. Likewise, the energy gap between $S_{1A}$ and $S_{1E}$ is preferably greater than kT in order to avoid back-transfer of excitons from $S_{1E}$ to $S_{1A}$.

A pathway for decay of the triplet exciton on $T_{1A}$ in competition with triplet-triplet annihilation may be the non-radiative (quenching) pathway to $S_{0A}$ described above with reference to FIG. 2. However, the present inventors have found that TTA occurs in systems containing polymers comprising repeat units of formula (I) as the triplet accepting material. Without wishing to be bound by any theory, it is believed that triplet excitons on $T_{1A}$ of polymers comprising a repeat unit of formula (I) have a relatively long lifetime $\tau_{T4}$. A relatively long lifetime not only means that the rate of decay to $S_{0A}$ is relatively slow but also that the likelihood of TTA is relatively high.

The lifetime of excited state triplets residing on the triplet accepting polymer is optionally at least 1 microsecond, optionally at least 10 microseconds, optionally at least 100 microseconds. The lifetime of a triplet exciton is its half-life, which may be measured by flash photolysis to measure monomolecular triplet lifetime as described in Handbook of Photochemistry, $2^{nd}$ Edition, Steven L Murov, Ian Carmichael and Gordon L Hug and references therein, the contents of which are incorporated herein by reference.

It will be appreciated that, unlike phosphorescent dopants, the triplet-accepting polymer does not provide an energetically favourable pathway for triplets to undergo radiative decay to produce phosphorescence, and as a result substantially none of the energy of the triplet exciton absorbed by the triplet-accepting polymer is lost from the triplet-accepting polymer in the form of phosphorescent light emission from the triplet-accepting polymer.

FIG. 3 illustrates a third energy transfer mechanism for an exemplary OLED.

In this case, triplet-triplet annihilation occurs between the triplet exciton of energy $T_{1A}$ located on the triplet accepting triplet-accepting unit and the triplet exciton of energy $T_{1E}$ located on the light-emitting polymer. It will be appreciated that this results in a triplet-triplet annihilated singlet exciton (TTAS) having an energy of up to $T_{1E}+T_{1A}$. This singlet exciton's energy level of $S_{nA}$ is higher in than that of $S_{1E}$ and so it may transfer its energy to $S_{1A}$ and from there to $S_{1E}$ from which light hv may be emitted as delayed fluorescence.

In FIGS. 2 and 3, although it may be preferable for energy level $S_{1A}$ to be greater than $S_{1E}$, it will be appreciated that this is not essential in order for triplet absorption to occur.

Without wishing to be bound by any theory, it is believed that avoiding formation of super-excited states on the light-emitting material formed during OLED driving may improve device lifetime. Moreover, by utilising a triplet accepting unit to generate TTA to produce stable delayed fluorescence it is possible to improve efficiency as compared to a device in which triplet excitons are quenched (as illustrated in FIG. 2) or as compared to a device in which there is no triplet accepting material wherein intensity of delayed fluorescence may drop sharply following initial OLED driving.

It will be appreciated that it is possible for two or all three of the triplet-quenching mechanisms and the two TTA mechanisms described above to occur within the same device, and that the amount of delayed fluorescence from each of the TTA two mechanisms will depend on factors such as the concentration of light emitting material, the concentration of triplet accepting units and the excited state lifetime of triplet excitons on the light emitting unit and the triplet accepting unit.

The rate constant for transfer of triplet excitons from the light-emitting material to the triplet-accepting polymer may be selected so as to be greater than the rate constant for quenching of triplet excitons.

Light emitted from light-emitting compositions of the invention includes delayed fluorescence as described above, as well as fluorescence arising directly from radiative decay of singlet excitons formed by recombination of holes and electrons on the light-emitting material ("prompt fluorescence").

The skilled person will be aware of methods to determine the presence of delayed fluorescence in light emitted from a light-emitting composition, as distinct from prompt fluorescence, for example by measuring light emission from a light-emitting composition following prompt fluorescence.

In the case of an OLED comprising the light-emitting composition, the delayed fluorescence can originate either from a TTA process, or from recombination of trapped charges with relatively long lifetimes. The TTA process can be distinguished from the trapped charge recombination process by applying a short spike of negative bias whilst measuring the intensity of the delayed fluorescence as described in detail by Popovic, Z. D. & Aziz, H. Delayed electroluminescence in small molecule based organic light emitting diodes: evidence for triplet-triplet annihilation and recombination centre mediated light generation mechanism. J. Appl. Phy. 98, 013510-5 (2005). If the negative bias has no lasting effect on the intensity of the delayed fluorescence, TTA is indicated (as opposed to non-prompt fluorescence arising from recombination of trapped charges where the delayed fluorescence is reduced after removal of the bias).

Triplet-Accepting Polymer

The triplet-accepting polymer is mixed with, the fluorescent light-emitting material and any other components of the light-emitting composition that forms the light-emitting layer.

The triplet-accepting polymer reduces the triplet exciton population of the fluorescent light-emitting material. The effect of a material on the triplet exciton population of a light-emitting material may be measured by quasi-continuous wave excited state absorption.

It will be appreciated that triplet-accepting materials will reduce the density of triplet excitons in a light-emitting layer, either by triplet exciton quenching or TTA, and a triplet-accepting material having a lowest triplet excited state lower than that of the emitting material is present if a reduction in triplet exciton population is observed when that material is used in combination with a light-emitting material as compared to the measured triplet exciton population on a light-emitting material alone.

Probes of triplet population may be performed as described in King, S., Rothe, C. & Monkman, A. "Triplet build in and decay of isolated polyspirobifluorene chains in dilute solution" *J. Chem. Phys.* 121, 10803-10808 (2004), and Rothe, C., King, S. M., Dias, F. & Monkman, A. P. "Triplet exciton state and related phenomena in the beta-phase of poly(9,9-dioctyl)fluorene" *Physical Review B* 70, (2004), which describe probes of polyfluorene triplet population performed at 780 nm. The skilled person will understand how to modify this probe for other light-emitting materials based on the excited state absorption features of those materials.

The fluorescent light-emitting material:triplet accepting polymer weight ratio may be at least 99.5:0.5 up to about 70:30 and may be in the range of about 99:1 up to about 80:20. A higher concentration of the triplet-accepting polymer increases the probability of TTA.

The triplet accepting polymer comprises repeat units of formula (I):

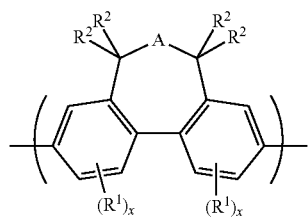

(I)

wherein A, $R^1$, $R^2$ and x are as described above.

The central ring of the repeat unit of formula (I) is an at least 7-membered ring. This central ring causes the two phenyl rings of the repeat unit of formula (I) to twist out of plane relative to each other, thereby limiting the extent of conjugation of the polymer. Without wishing to be bound by any theory, it is believed that this twist may inhibit diffusion of triplet excitons, reducing the probability of triplet excitons encountering a quenching site before undergoing TTA. Furthermore, the twist provided by the repeat unit of formula (I) may help the polymer maintain a high lowest singlet excited state energy level $S_1$ which may minimise or prevent transfer of singlet excitons from the fluorescent light-emitting material to the polymer comprising the repeat unit of formula (I).

A may be selected from the group consisting of O, S, $-NR^2-$ and $-CR^2_2-$.

Each $R^2$ may independently be selected from the group consisting of H and $C_{1-40}$ hydrocarbyl.

Each $R^1$, where present, may independently be selected from $C_{1-40}$ hydrocarbyl.

Exemplary $C_{1-40}$ hydrocarbyl groups include branched, linear or cyclic $C_{1-20}$ alkyl; unsubstituted aryl; aryl substituted with one or more $C_{1-20}$ alkyl groups; and a branched or linear chain of aryl groups, for example 3,5-diphenylbenzene, wherein each aryl is independently unsubstituted or substituted with one or more substituents. An exemplary aryl of a $C_{1-40}$ hydrocarbyl group is phenyl.

Each $R^2$ may independently be selected from $C_{1-20}$ alkyl wherein non-adjacent C atoms of the $C_{1-20}$ alkyl may be replaced by an aryl or heteroaryl group, for example phenyl; O; S; C=O; COO or $NR^{11}$ wherein $R^{11}$ is a substituent, for example $C_{1-10}$ alkyl.

In the case where A is $-CR^2_2-$, at least one $R^2$ of $-CR^2_2-$ is preferably $C_{1-20}$ alkyl or $C_{10-20}$ alkyl.

Exemplary groups of formula (I) include the following, each of which may be unsubstituted or substituted with one or more substituents $R^1$ and/or $R^2$:

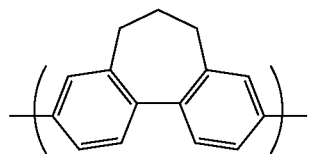

Exemplary triplet-accepting repeat units are selected from polycyclic aromatic hydrocarbons that may be unsubstituted or substituted with one or more substituents. "Polycyclic aromatic hydrocarbon" as used herein means a hydrocarbon structure of two or more fused rings wherein all atoms of the fused rings are $sp^2$ hybridised. Exemplary polycyclic aromatic hydrocarbons include, for example, anthracene and pyrene. Fluorene is not a "polycyclic aromatic hydrocarbon" as used herein.

The triplet-accepting repeat unit provides the polymer with a $T_1$ energy level that is low enough to allow transfer of triplet excitons from the fluorescent light-emitting material and a $s_1$ energy level that is high enough to avoid substantial transfer of singlet excitons from the fluorescent light-emitting material to the triplet-accepting polymer.

Optionally, the polycyclic aromatic hydrocarbon contains no more than 4 fused benzene rings.

Exemplary polycyclic aromatic hydrocarbon repeat units include anthracene and pyrene repeat units, for example repeat units of formulae (II) and (III)

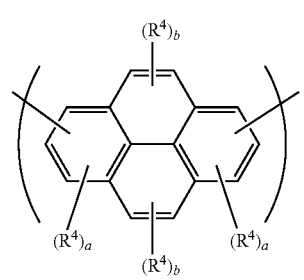

(II)

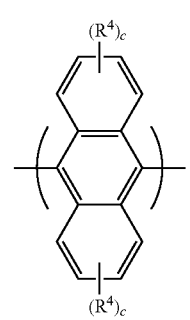

(III)

wherein $R^4$ in each occurrence is independently a substituent; each a is independently 0, 1 or 2; each b is independently 0, 1 or 2; and each c is 0, 1, 2, 3 or 4.

The repeat unit of formula (II) may have formula (IIa):

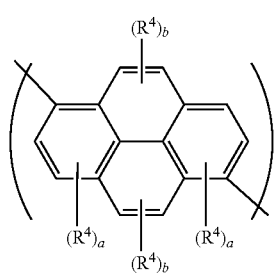

(IIa)

Optionally, at least one a and/or at least one b is at least 1, and each $R^4$ is independently selected from $C_{1-40}$ hydrocarbyl.

Optionally, at least one a and/or at least one b is at least 1 and each $R^4$ is independently selected from $C_{1-20}$ alkyl wherein non-adjacent C atoms of the $C_{1-20}$ alkyl may be replaced by O, S, C=O, COO or $NR^{11}$ wherein $R^{11}$ is a substituent, optionally $C_{1-20}$ alkyl.

In the case where the triplet-accepting polymer is a copolymer, the copolymer may contain at least 0.5-50 mol % of repeat units of formula (I), optionally 10-40 mol % repeat units of formula (I).

The triplet-accepting polymer may contain 30-50 mol % of triplet-accepting repeat units.

The triplet-accepting polymer may contain one or more further co-repeat units. Exemplary further co-repeat units include phenylene, fluorene and dihydrophenanthrene repeat units, each of which may be unsubstituted or substituted with one or more substituents. The further co-repeat units may form 0.5-49.5 mol % of the repeat units of the polymer, optionally 5-40 mol %.

Optionally, the triplet-accepting polymer contains triplet accepting repeat units separated from one another by a repeat unit of formula (I) or (where present) a further co-repeat unit. Optionally, the polymer contains an alternating AB repeat unit structure wherein A is a triplet-accepting repeat unit and B is a repeat unit of formula (I) or a further co-repeat unit. Polymers of this type may be prepared by Suzuki polymerisation.

One preferred class of co-repeat units have formula (VI):

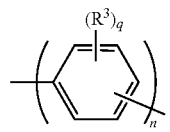

(VI)

wherein q in each occurrence is independently 0, 1, 2, 3 or 4, optionally 1 or 2; n is 1, 2 or 3; and $R^3$ independently in each occurrence is a substituent.

Where present, each $R^3$ may independently be selected from the group consisting of:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups;
- a linear or branched chain of aryl or heteroaryl groups, each of which groups may independently be substituted, for example a group of formula —$(Ar^3)_r$- wherein each $Ar^3$ is independently an aryl or heteroaryl group and r is at least 2, preferably a branched or linear chain of phenyl groups each of which may be unsubstituted or substituted with one or more $C_{1-20}$ alkyl groups; and
- a crosslinkable-group, for example a group comprising a double bond such and a vinyl or acrylate group, or a benzocyclobutane group.

In the case where $R^3$ comprises an aryl or heteroaryl group, or a linear or branched chain of aryl or heteroaryl groups, the or each aryl or heteroaryl group may be substituted with one or more substituents $R^7$ selected from the group consisting of:
- alkyl, for example $C_{1-20}$ alkyl, wherein one or more non-adjacent C atoms may be replaced with O, S, substituted N, C=O and —COO— and one or more H atoms of the alkyl group may be replaced with F;
- $NR^9_2$, $OR^9$, $SR^9$, $SiR^9_3$ and
- fluorine, nitro and cyano;

wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^9$— wherein $R^9$ is as described above.

Preferably, each $R^3$, where present, is independently selected from $C_{1-40}$ hydrocarbyl, and is more preferably selected from $C_{1-20}$ alkyl; unsubstituted phenyl; phenyl substituted with one or more $C_{1-20}$ alkyl groups; a linear or branched chain of phenyl groups, wherein each phenyl may be unsubstituted or substituted with one or more substituents; and a crosslinkable group.

If n is 1 then exemplary repeat units of formula (VI) include the following:

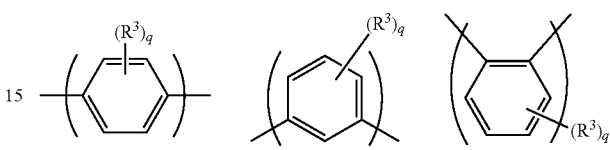

A particularly preferred repeat unit of formula (VI) has formula (VIa):

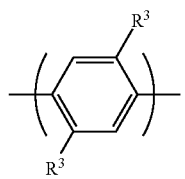

(VIa)

Substituents $R^3$ of formula (VIa) are adjacent to linking positions of the repeat unit, which may cause steric hindrance between the repeat unit of formula (VIa) and adjacent repeat units, resulting in the repeat unit of formula (VIa) twisting out of plane relative to one or both adjacent repeat units.

Exemplary repeat units where n is 2 or 3 include the following:

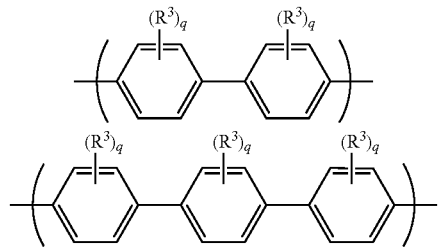

A preferred repeat unit has formula (VIb):

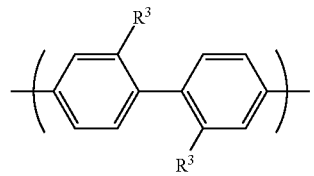

(VIb)

The two $R^3$ groups of formula (VIb) may cause steric hindrance between the phenyl rings they are bound to, resulting in twisting of the two phenyl rings relative to one another.

A further class of co-repeat units is optionally substituted fluorene repeat units, such as repeat units of formula (VII):

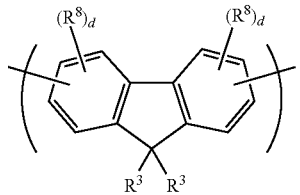

(VII)

wherein $R^3$ in each occurrence is the same or different and is a substituent as described with reference to formula (VI), and wherein the two groups $R^3$ may be linked to form an unsubstituted or substituted ring; $R^8$ is a substituent; and d is 0, 1, 2 or 3.

The aromatic carbon atoms of the fluorene repeat unit may be unsubstituted, or may be substituted with one or more substituents $R^8$. Exemplary substituents $R^8$ are alkyl, for example $C_{1-20}$ alkyl, wherein one or more non-adjacent C atoms may be replaced with O, S, NH or substituted N, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Substituted N, where present, may be —$NR^5$— wherein $R^5$ is $C_{1-20}$ alkyl; unsubstituted phenyl; or phenyl substituted with one or more $C_{1-20}$ alkyl groups.

The extent of conjugation of repeat units of formula (VII) to aryl or heteroaryl groups of adjacent repeat units may be controlled by (a) linking the repeat unit through the 3- and/or 6-positions to limit the extent of conjugation across the repeat unit, and/or (b) substituting the repeat unit with one or more substituents $R^8$ in or more positions adjacent to the linking positions in order to create a twist with the adjacent repeat unit or units, for example a 2,7-linked fluorene carrying a $C_{1-20}$ alkyl substituent in one or both of the 3- and 6-positions.

The repeat unit of formula (VII) may be an optionally substituted 2,7-linked repeat unit of formula (VIIa):

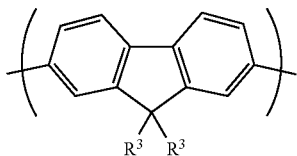

(VIIa)

Optionally, the repeat unit of formula (VIIa) is not substituted in a position adjacent to the 2- or 7-position. Linkage through the 2- and 7-positions and absence of substituents adjacent to these linking positions provides a repeat unit that is capable of providing a relatively high degree of conjugation across the repeat unit.

The repeat unit of formula (VII) may be an optionally substituted 3,6-linked repeat unit of formula (VIIb)

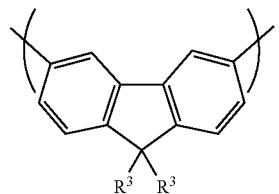

(VIIb)

The extent of conjugation across a repeat unit of formula (VIIb) may be relatively low as compared to a repeat unit of formula (VIIa).

Another exemplary co-repeat unit has formula (VIII):

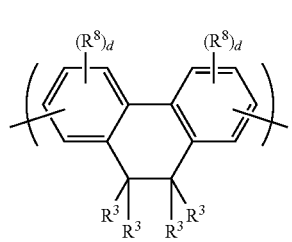

(VIII)

wherein $R^3$, $R^8$ and d are as described with reference to formula (VI) and (VII) above. Any of the $R^3$ groups may be linked to any other of the $R^3$ groups to form a ring. The ring so formed may be unsubstituted or may be substituted with one or more substituents, optionally one or more $C_{1-20}$ alkyl groups.

Repeat units of formula (VIII) may have formula (VIIIa) or (VIIIb):

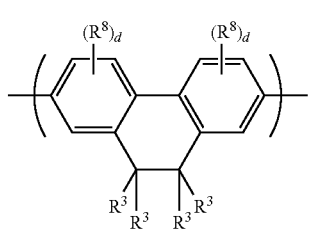

(VIIIa)

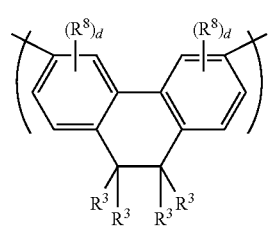

(VIIIb)

An exemplary repeat unit of formula (VIII) has the following structure, wherein aromatic carbon atoms may each independently be unsubstituted or substituted with a substituent $R^8$, and wherein the cyclopentyl groups may each independently be unsubstituted or substituted with one or more substituents, for example one or more $C_{1-20}$ alkyl groups:

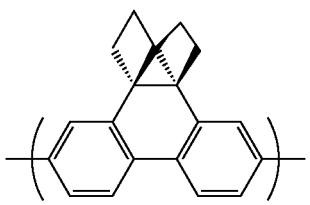

The polystyrene-equivalent number-average molecular weight (Mn) measured by gel permeation chromatography of the polymers described herein may be in the range of about $1 \times 10^3$ to $1 \times 10^8$, and preferably $1 \times 10^4$ to $5 \times 10^6$. The polystyrene-equivalent weight-average molecular weight (Mw) of the polymers described herein may be $1 \times 10^3$ to $1 \times 10^8$, and preferably $1 \times 10^4$ to $1 \times 10^7$.

Polymers as described herein are suitably amorphous.

Light Emitting Material

The light-emitting material may be any form of organic fluorescent material including, without limitation, small molecules, dendrimeric and polymeric fluorescent materials.

A light-emitting polymer may be a light-emitting homopolymer comprising light-emitting repeat units, or it may be a copolymer comprising light-emitting repeat units and further repeat units such as hole transporting and/or electron transporting repeat units as disclosed in, for example, WO 00/55927. Each repeat unit may be provided in a main chain or side chain of the polymer.

A light-emitting polymer may contain repeat units in the polymer backbone that are conjugated together.

Light-emitting polymers may contain arylamine repeat units, for example repeat units of formula (IX):

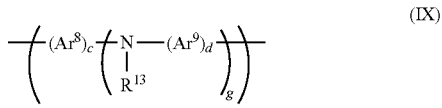

wherein $Ar^8$ and $Ar^9$ in each occurrence are independently selected from substituted or unsubstituted aryl or heteroaryl, g is greater than or equal to 1, preferably 1 or 2, $R^{13}$ is H or a substituent, preferably a substituent, and c and d are each independently 1, 2 or 3.

$R^{13}$, which may be the same or different in each occurrence when g>1, is preferably selected from the group consisting of alkyl, for example $C_{1-20}$ alkyl, $Ar^{10}$, a branched or linear chain of $Ar^{10}$ groups, or a crosslinkable unit that is bound directly to the N atom of formula (IX) or spaced apart therefrom by a spacer group, wherein $Ar^{10}$ in each occurrence is independently optionally substituted aryl or heteroaryl. Exemplary spacer groups are $C_{1-20}$ alkyl, phenyl and phenyl-$C_{1-20}$ alkyl.

Any of $Ar^8$, $Ar^9$ and, if present, $Ar^{10}$ in the repeat unit of Formula (IX) may be linked by a direct bond or a divalent linking atom or group to another of $Ar^8$, $Ar^9$ and $Ar^{10}$. Preferred divalent linking atoms and groups include O, S; substituted N; and substituted C.

Any of $Ar^8$, $Ar^9$ and, if present, $Ar^{10}$ may be substituted with one or more substituents. Exemplary substituents are substituents $R^{10}$, wherein each $R^{10}$ may independently be selected from the group consisting of:

substituted or unsubstituted alkyl, optionally $C_{1-20}$ alkyl, wherein one or more non-adjacent C atoms may be replaced with optionally substituted aryl or heteroaryl, O, S, substituted N, C=O or —COO— and one or more H atoms may be replaced with F; and a crosslinkable group attached directly to the fluorene unit or spaced apart therefrom by a spacer group, for example a group comprising a double bond such and a vinyl or acrylate group, or a benzocyclobutane group Preferred repeat units of formula (IX) have formulae 1-3:

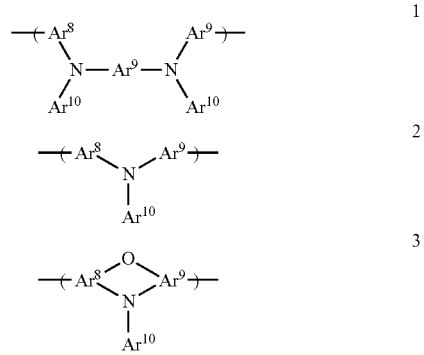

The polymer may contain one, two or more different repeat units of formula (IX).

In one optional arrangement, central $Ar^9$ group linked to two N atoms, for example as in formula I, is phenylene that may be unsubstituted or substituted with one or more substituents $R^{10}$.

In another optional arrangement, the central $Ar^9$ group of formula I is a polycyclic aromatic that may be unsubstituted or substituted with one or more substituents $R^{10}$. Exemplary polycyclic aromatic groups are naphthalene, perylene, anthracene, fluorene, phenanthrene and dihydrophenanthrene. Each of these polycyclic aromatic groups may be substituted with one or more substituents $R^{10}$. Two substituents $R^{10}$ may be linked to form a substituted or unsubstituted ring.

Optionally, $Ar^8$ is phenyl that may be unsubstituted or substituted with one or more substituents $R^{10}$.

Optionally, $Ar^9$ groups linked to only one N atom of the repeat unit of formula (IX) are phenyl that may be unsubstituted or substituted with one or more substituents $R^{10}$.

$R^{13}$ of formula (IXa) is preferably a hydrocarbyl, preferably $C_{1-20}$ alkyl, phenyl that is unsubstituted or substituted with one or more $C_{1-20}$ alkyl groups, or a branched or linear chain of phenyl groups wherein each said phenyl group is unsubstituted or substituted with one or more $C_{1-20}$ alkyl groups.

Optionally, $R^{13}$ is $Ar^{10}$, for example phenyl, or is $-(Ar^{10})_r$ wherein r is at least 2 and wherein the group $-(Ar^{10})_r$ forms a linear or branched chain of aromatic or heteroaromatic groups, for example 3,5-diphenylbenzene wherein each phenyl may be substituted with one or more substituents R10, for example one or more $C_{1-20}$ alkyl groups.

Optionally, c, d and g are each 1 and $Ar^8$ and $Ar^9$ are phenyl linked by an oxygen atom to form a phenoxazine ring.

Amine repeat units may provide hole-transporting and/or light-emitting functionality.

Exemplary light-emitting amine repeat units include a blue light-emitting repeat unit of formula (IXa) and a green light-emitting repeat unit formula (IXb):

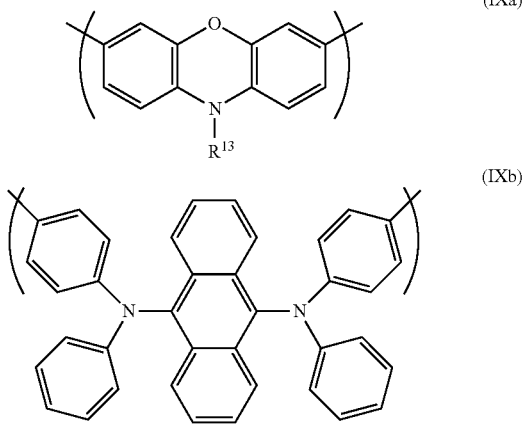

The repeat units of formula (IXa) and (IXb) may be unsubstituted or one or more of the rings of the repeat unit of formula (IXb) may be substituted with one or more substituents $R^5$, preferably one or more $C_{1-20}$ alkyl groups.

Amine repeat units may be provided in a copolymer with one or more co-repeat units, and may form 0.5 mol % up to about 50 mol % of the repeat units of the light-emitting copolymer, optionally about 1-25 mol %, optionally about 1-10 mol %.

Exemplary co-repeat units include, without limitation, fluorene, phenylene, indenofluorene, dihydrophenanthrene repeat units. Co-repeat units of the light-emitting polymer may include one or more of the co-repeat units (VI), (VII) and (VIII) described above with reference to the triplet-accepting polymer; phenanthrene repeat units; naphthalene repeat units; anthracene repeat units; and perylene repeat units. Each of these repeat units may be linked to adjacent repeat units through any two of the aromatic carbon atoms of these units. Specific exemplary linkages include 9,10-anthracene; 2,6-anthracene; 1,4-naphthalene; 2,6-naphthalene; 2,7-phenanthrene; and 2,5-perylene. Each of these repeat units may be substituted or unsubstituted, for example substituted with one or more $C_{1-40}$ hydrocarbyl groups.

Polymer Synthesis

Preferred methods for preparation of conjugated light-emitting polymers comprise a "metal insertion" wherein the metal atom of a metal complex catalyst is inserted between an aryl or heteroaryl group and a leaving group of a monomer. Exemplary metal insertion methods are Suzuki polymerisation as described in, for example, WO 00/53656 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units illustrated throughout this application may be derived from a monomer carrying suitable leaving groups. Likewise, an end group or side group may be bound to the polymer by reaction of a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Charge Transporting and Charge Blocking Layers

In the case of an OLED, a hole transporting layer may be provided between the anode and the light-emitting layer or layers. Likewise, an electron transporting layer may be provided between the cathode and the light-emitting layer or layers.

Similarly, an electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

A charge-transporting layer or charge-blocking layer may be cross-linked, particularly if a layer overlying that charge-transporting or charge-blocking layer is deposited from a solution. The crosslinkable group used for this crosslinking may be a crosslinkable group comprising a reactive double bond such and a vinyl or acrylate group, or a benzocyclobutane group.

If present, a hole transporting layer located between the anode and the light-emitting layers preferably has a HOMO level of less than or equal to 5.5 eV, more preferably around 4.8-5.5 eV or 5.1-5.3 eV as measured by cyclic voltammetry. The HOMO level of the hole transport layer may be selected so as to be within 0.2 eV, optionally within 0.1 eV, of an adjacent layer (such as a light-emitting layer) in order to provide a small barrier to hole transport between these layers.

If present, an electron transporting layer located between the light-emitting layers and cathode preferably has a LUMO level of around 2.5-3.5 eV as measured by cyclic voltammetry. For example, a layer of a silicon monoxide or silicon dioxide or other thin dielectric layer having thickness in the range of 0.2-2 nm may be provided between the light-emitting layer nearest the cathode and the cathode. HOMO and LUMO levels may be measured using cyclic voltammetry.

A hole transporting layer may contain a homopolymer or copolymer comprising a repeat unit of formula (IX) as described above, for example a copolymer comprising one or more amine repeat units of formula (IX) and one or more arylene repeat units, for example one or more arylene repeat units selected from formulae (VI), (VII) and (VIII).

An electron transporting layer may contain a polymer comprising a chain of optionally substituted arylene repeat units, such as a chain of fluorene repeat units.

If a hole- or electron-transporting layer is adjacent a light-emitting layer containing a phosphorescent material then the $T_1$ energy level of the material or materials of that layer are preferably higher than that of the phosphorescent emitter in the adjacent light-emitting layer.

Hole Injection Layers

A conductive hole injection layer, which may be formed from a conductive organic or inorganic material, may be provided between the anode 101 and the light-emitting layer 103 of an OLED as illustrated in FIG. 1 to assist hole injection from the anode into the layer or layers of semiconducting polymer. Examples of doped organic hole injection materials include optionally substituted, doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29 (11), 2750-2753.

Cathode

The cathode 105 is selected from materials that have a workfunction allowing injection of electrons into the light-emitting layer of the OLED. Other factors influence the selection of the cathode such as the possibility of adverse interactions between the cathode and the light-emitting material. The cathode may consist of a single material such as a layer of aluminium. Alternatively, it may comprise a plurality of conductive materials such as metals, for example a bilayer of a low workfunction material and a high workfunction material such as calcium and aluminium, for example as disclosed in WO 98/10621. The cathode may comprise elemental barium, for example as disclosed in WO 98/57381, Appl. Phys. Lett. 2002, 81 (4), 634 and WO 02/84759. The cathode may comprise a thin (e.g. 1-5 nm) layer of metal compound, in particular an oxide or fluoride of an alkali or alkali earth metal, between the organic layers of the device and one or more conductive cathode layers to assist electron injection, for example lithium fluoride as disclosed in WO 00/48258; barium fluoride as disclosed in Appl. Phys. Lett. 2001, 79 (5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48 (11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminium. Examples of transparent cathode devices are disclosed in, for example, GB 2348316.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

A formulation suitable for forming a light-emitting layer may be formed from the composition of the invention and one or more suitable solvents.

The formulation may be a solution of the composition in the one or more solvents, or may be a dispersion in the one or more solvents in which one or more components are not dissolved. Preferably, the formulation is a solution.

Solvents suitable for dissolving compositions of the invention, particularly compositions containing polymers comprising alkyl substituents, include benzenes substituted with one or more $C_{1-10}$ alkyl or $C_{1-10}$ alkoxy groups, for example toluene, xylenes and methylanisoles.

Particularly preferred solution deposition techniques including printing and coating techniques such spin-coating and inkjet printing.

Spin-coating is particularly suitable for devices wherein patterning of the light-emitting layer is unnecessary—for example for lighting applications or simple monochrome segmented displays.

Inkjet printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing and screen printing.

EXAMPLES

Monomer Example 1

Monomer Example 1 was prepared according to the following reaction scheme and the method set out below:

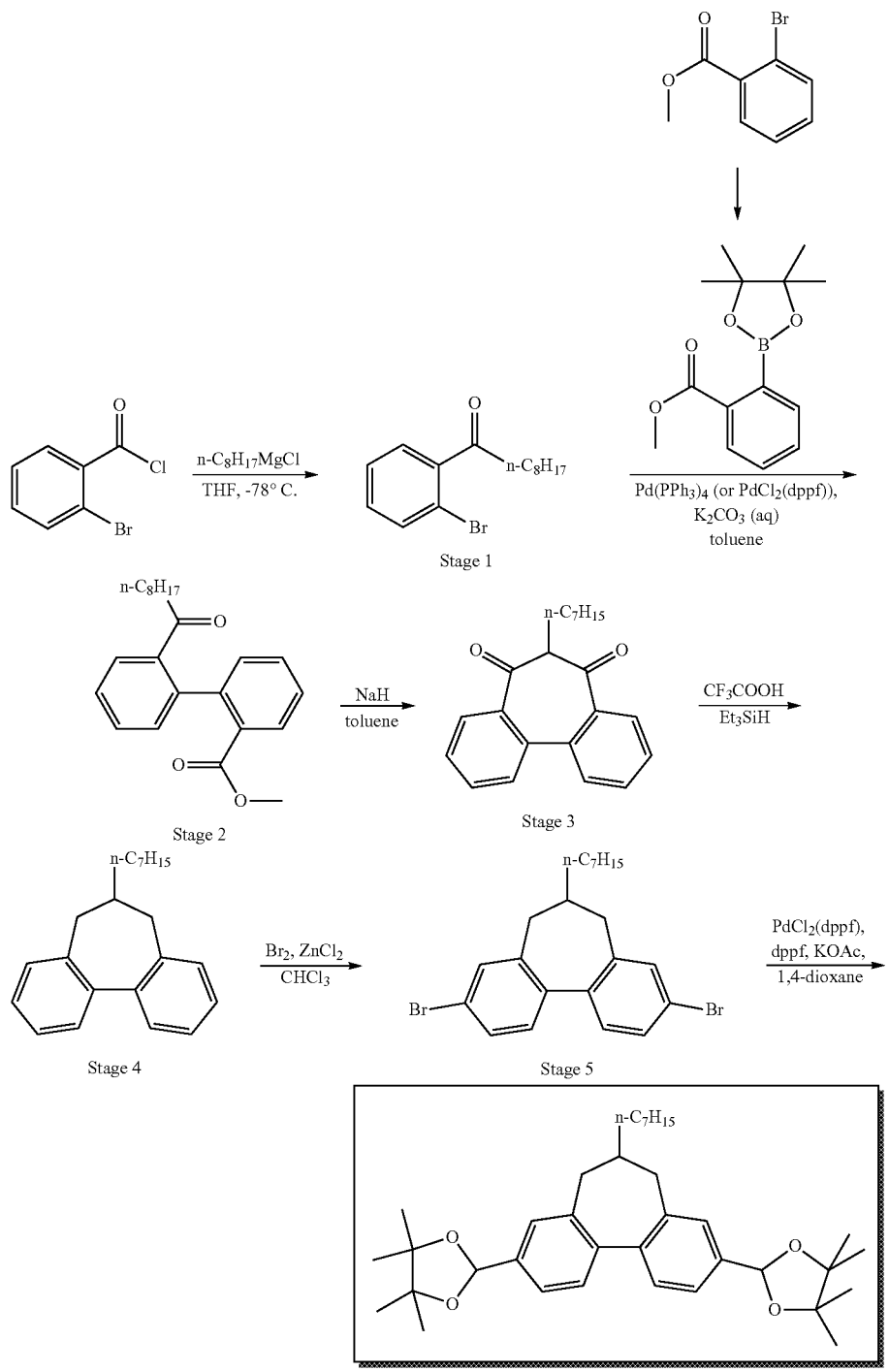

Monomer Example 1

Experimental

Stage 1: 1-(2'-Bromophenyl)nonan-1one

2-Bromobenzoyl chloride (585 g, 2.67 mol) was dissolved in dry tetrahydrofuran (6.8 lt) under a nitrogen atmosphere, and cooled to −70° C. N-Octylmagnesium chloride (2M in tetrahydrofuran, 1330 ml) was added drop wise at −65-−70° C. over 4 hours. The reaction was stirred at ambient temperature overnight. The reaction mixture was poured into a 10% aqueous ammonium chloride solution (2.5 L), the two layers were separated and the organic layer washed with 10% aqueous ammonium chloride (2 L). The combined organics were dried over magnesium sulphate, and filtered through Celite. The filtrate was concentrated under vacuum to leave a pale yellow/green oil 808 g. The oil was filtered through a GF/F fibre pad to remove solids, giving 785 g of liquid. This was purified by silica gel chromatography eluting with hexane. The product was collected and concentrated to give 547 g of product, GC purity 87.2%. The product was used in the next step without further purification.

Stage 2: Methyl 2'-nonoylbiphenyl-2-carboxylate

Synthesis of 1-(2-Methoxycarbonylphenyl)-4,4,5,5-tetramethyl-1,3,2-dioxaborolane Methyl 2-bromobenzoate (477 g, 2.22 mol) and bis(pinacolato)diboron (620 g, 2.44 mol) were dissolved in 1,4-dioxan (4.8 L) and the solution was stirred and purged with nitrogen for 1 hour. 1,1'-Bis(diphenylphosphino)dichloropalladium dichloromethane complex (19 g, 0.026 mol, 1.17 mol %) was added and the mixture was purged with nitrogen for a further 1 hour. Potassium acetate (anhydrous) (644 g, 6.56 mol) was added and the mixture purged for 5 minutes. The reaction was stirred overnight at 110° C. under nitrogen and then the reaction was cooled to room temperature, filtered through Celite, and washed through with toluene (4 L). The filtrate was concentrated under reduced pressure to leave a black oil (837 g). This oil was purified by silica gel chromatography eluting with hexane followed by 9:1 hexane/ethyl acetate to leave a yellow oil. The oil crystallised and the liquid was drained off, to leave the product as a low melting solid (~100% yield), GC purity 96.4%.

Synthesis of Methyl 2'-nonoylbiphenyl-2-carboxylate 1-(2-Methoxycarbonylphenyl)-4,4,5,5-tetramethyl-1,3,2-dioxoborolane (630 g, 2.4 mol), and 1-(2'-bromophenyl)nonan-1-one (505 g, 1.70 mol) were dissolved in toluene (9.7 L) and the mixture was stirred and degassed with nitrogen for 1 hour. Simultaneously, potassium carbonate (795 g, 5.75 mol) was dissolved in water (1260 ml), and degassed with nitrogen. The two solutions were mixed together and degassed for a further 1 hour. 1,1'-Bis(diphenylphosphino)ferrocene dichloropalladium dichloromethane complex (25 g, 0.034 mol) was added, and degassed with nitrogen for a further 5 minutes. The mixture was stirred and heated at reflux overnight. The reaction mixture was cooled to ambient temperature and filtered through Celite. The aqueous layer was separated off, and the toluene layer dried over magnesium sulphate. The dried solution was filtered through Celite and the solvent recovered to leave a green oil (836 g) GC purity 63.5%. The oil was purified by silica gel chromatography eluting with hexane followed by 2% ethyl acetate in hexane to give a yellow/green oil (381 g, 1.08 mol, 44.3%), GC purity 93.4%.

Stage 3: 6-Heptyldibenzo[a,c]cycloheptane-5,7-dione

Methyl 2'-nonoylbiphenyl-2-carboxylate (381 g, 1.08 mol) was dissolved in toluene (8.5 L) and stirred under a nitrogen atmosphere. Sodium hydride (166 g, 4 eq.) was added in 4 equal portions, at 10 minute intervals. The reaction mixture was stirred and heated to 115° C., for 3-4 hours, then allowed to cool overnight to room temperature. GC indicated ~20% starting material left, a further portion of sodium hydride (38 g) was added and the mixture was reheated to 115° C. for 3 hours at which point GC showed completion. The reaction mixture was cooled to −5° C., a saturated solution of hydrogen chloride in diethyl ether (2 L) was added, and the mixture stirred for several hours at ambient temperature. The acidic reaction mixture was filtered and washed with toluene (1 L). The filtrate was concentrated to leave a brown oil (500 g, assume 100%~348 g) GC purity 76% with no impurity >1%, mainly mineral oil from the sodium hydride.

Stage 4: 6-Heptyldibenzo[a,c]cycloheptane

6-Heptyldibenzo[a,c]cycloheptane-5,7-dione (nominal 348 g, 1.09 mol) was added to a mixture of trifluoroacetic acid (4 Kg) and hexane (300 ml). The mixture was stirred under a nitrogen atmosphere at ambient temperature. Triethylsilane (200 ml, 1.25 mol) was added quickly, and the reaction warmed to 40° C. Addition was stopped for 10 minutes. Additional triethylsilane (670 ml, 4.2 mol) was added over ~2 hours, and the mixture stirred overnight at ambient temperature. The reaction was quenched by addition of water (2 L). The organic layer was separated off and the aqueous layer was extracted with hexane (3×1 L). The combined organic extracts were stirred with 10% aqueous potassium phosphate solution (1 L), for 2 hours and then separated. The combined organic extracts were then stirred with 10% aqueous potassium phosphate solution (1 L) for another 2 hours and then separated. The organic layer was dried over sodium sulphate, and filtered through Celite. The filtrate was concentrated to a yellow liquid (830 g) and purified by silica gel chromatography eluting with hexane. The material was purified by silica gel chromatography eluting with hexane. The material was filtered through a GF/F fibre pad, to leave a yellow oil.

HPLC purity: 97.8%.
GLC purity: 96.6%.
Residual solvent: 0.04%.
Refractive index: 1.5596
$^1$H NMR (CDCl$_3$) δ ppm: 7.4 (d, 2H, Aromatic), 7.35 (t, 2H, Aromatic), 7.30 (t, 2H, Aromatic), 7.20 (d, 2H, Aromatic), 2.60 (q, 2H, CH$_2$), 2.3 (Sept, 1H, CH), 1.35 (m, 14H, 7×CH$_2$), 0.9 (t, 3H, CH$_3$).

Stage 5: 3,9-Dibromo-6-heptyldibenzo[a,c]cycloheptane

6-Heptyldibenzo[a,c]cycloheptane (108.5 g, 0.371 mol. 1 eq.), was dissolved in chloroform (1 L) and anhydrous zinc chloride (17 g, 0.125 mol. 0.34 eq.) was added to the mix. The reaction was stirred and cooled to −10° C. Bromine (42 ml, 130.2 g, 0.815 mol. 2.2 eq.) was dissolved in chloroform (200 ml) and this was added to the reaction drop wise over 2 hours keeping the temperature below 0° C. The reaction was left to stir at room temperature and followed by GC. More zinc chloride was added (2 g, 0.015 mol, 0.04 eq.) after 40, 64, and 88 hours. Total amount of zinc chloride used was 23 g, 0.169 mol, 0.46 eq. After 180 hours, the reaction was quenched by the careful addition of saturated sodium carbonate solution (400 ml) and stirred for 15 minutes. The organic layer was separated, washed with a further 400 ml of saturated sodium carbonate solution, and then with water (4×400 ml). The solution was dried over sodium sulphate, filtered through Celite and stripped to leave an orange/brown oil (171 g). The oil was dissolved in dichloromethane (~500 ml) and passed through a plug of silica gel (500 g), eluting with dichloromethane (4 L). The solution was stripped to dryness to leave an orange oil (170 g). This material was used without further purification.

Monomer Example 1

3,9-dibromo-6-heptyldibenzo[a,c]cycloheptane (150 g, 0.333 mol, 1 eq) and bis(pinacolato)diboron (195 g, 0.768 mol. 2.30 eq.) were dissolved in 1,4-dioxane (1500 ml). The mixture was stirred and degassed with nitrogen for 30 minutes. [1,1' Bis(diphenylphosphino)ferrocene]palladium (II)chloride complex (5 g, 0.0061 mol, 0.79 mol %), and 1,1'-bis(diphenylphosphino)ferrocene (3 g, 0.0054 mol, 0.70 mol %) was added. The mixture was purged with nitrogen for a further 30 minutes. Potassium acetate (anhydrous) (200 g, 2.04 mol, 6.13 eq.) was added and the mixture purged for 5 minutes. The mixture was stirred and heated at reflux (bath temperature 120° C.) overnight, under nitrogen. The reaction mixture was cooled to ambient temperature and filtered through a plug of magnesium silicate on top of silica gel, and washed through with toluene (~4 L). The solution was stripped to a brown oil and the oil was dissolved in a minimum of toluene (~200 ml), and passed through a second plug of magnesium silicate (500 g) on top of silica gel (500 g). The product was eluted through with toluene (10 L), to leave a pale yellow solution. The solution was concentrated to dryness to leave an orange oil, which slowly crystallised. This solid was triturated with acetonitrile (~150 ml), the white solid was recovered by filtration, washed with acetonitrile (50 ml), and dried. The solid was dissolved in toluene at 80-90° C. to give a clear solution. Acetonitrile was added until the solution became turbid, then allowed to cool to room temperature overnight with stirring, the solid was recovered by filtration, washed with acetonitrile and dried. The solid was dissolved in toluene at 80-90° C., acetonitrile was added and the mixture was left to stir and cool to room temperature overnight then the solid was recovered by filtration, washed with acetonitrile and dried. The previous step was repeated a further three times. All crystallisation filtrates combined and stripped to get a second crop.

HPLC purity: 99.88%.

Melting point: 178-180° C.

$^1$H NMR (CDCl$_3$) δ ppm: 7.79 (d, 2H, Aromatic), 7.66 (d, 2H, Aromatic), 7.41 (d, 2H, Aromatic) 2.60 (q, 2H, CH$_2$), 2.3 (m, 1H, CH) 1.35 (s, 24H, 8×CH$_3$), 1.27 (m, 12H, 6×CH$_2$), 0.91 (t, 3H, CH$_3$).

Monomer Example 2

Monomer Example 2 was prepared according to the following reaction scheme and the method set out below:

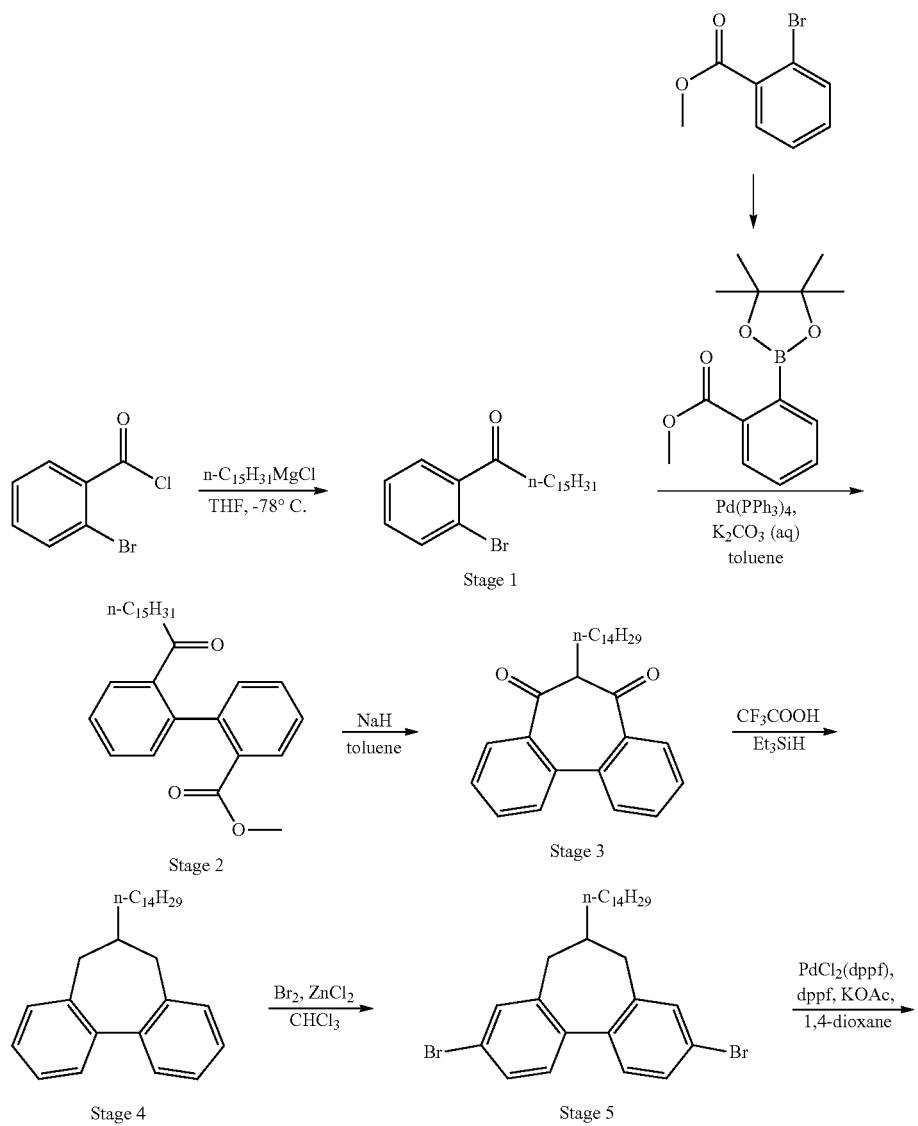

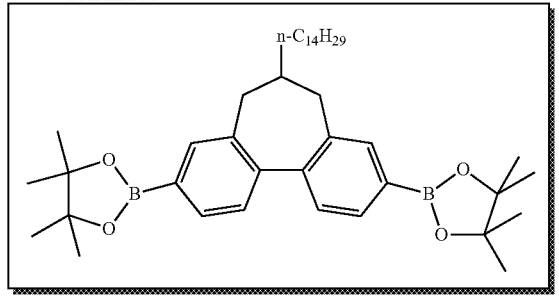

Monomer Example 2

Stage 1: 1-(2'-Bromophenyl)hexadecan-1-one

A 10 L 4-necked round-bottomed flask, equipped with a mechanical overhead stirrer, condenser, nitrogen inlet and exhaust. A Grignard reagent was prepared by the drop wise addition of 1-bromo pentadecane (199.15 g, 0.683 mol) to a stirred suspension of iodine-activated magnesium (19.69 g, 0.82 mol) in THF (3750 mL). In a separate 10 L 4-necked round-bottomed flask, LiBr (173.9 g, 2.003 mol) in THF (2000 mL) was added to a stirred suspension of CuBr (107.8 g, 0.752 mol) in THF (1750 mL) to form a pale green suspension. This mixture was cooled to −100° C. using toluene/liquid nitrogen bath. The Grignard reagent was slowly added to the LiBr/CuBr suspension using cannula by controlling the temperature of the reaction mixture below −75° C. 2-Bromo benzoyl chloride (150 g, 0.683 mol) was then added slowly via syringe to maintain a temperature below −75° C. The mixture was stirred at −90° C. to −95° C. for 60 min, and then allowed to attain room temperature in 16 h. Reaction mixture was quenched with 10% aq. NH$_4$Cl solution (500 mL). The organic layer was separated and the aqueous layer extracted repeatedly with ethyl acetate (500 mL×2). The combined organic layers were dried over dry sodium sulphate and concentrated to afford 220 g of crude product. The crude compound was purified by column chromatography (silica gel 230-400 mesh) to afford 185 g (69%) of the product as colorless viscous oil.

$^1$H NMR (400 MHz, CDCl$_3$): δ [ppm] 0.90 (t, J=8.56 Hz, 3H), 1.18-1.42 (m, 24H), 1.69-1.78 (m, 2H), 2.92 (t, J=8.76 Hz, 2H), 7.28-7.34 (m, 1H), 7.36-7.39 (m, 2H), 7.62 (d, J=7.88 Hz, 1H)

Stage 2: Methyl 2'-hexadecoylbiphenyl-2-carboxylate

Synthesis of 1-(2-methoxycarbonylphenyl)-4,4,5,5-tetramethyl-1,3,2-dioxaborolane A 2 L three-necked round-bottom flask, equipped with a mechanical overhead stirrer, condenser, nitrogen inlet and exhaust. Methyl 2-bromobenzoate (105 g, 0.488 mol), bis(pinacolato)diboron (161.2 g, 0.634 mol) and potassium acetate (114.8 g, 1.172 mol) were taken in toluene and N$_2$ gas was purged through the mixture for 30 minutes. PdCl$_2$(dppf) (15.9 g, 0.019 mol) was added and N$_2$ gas was purged through the mixture for another 30 minutes. The reaction mixture was heated to 110° C. and stirred for 16 h. The reaction mixture was cooled to room temperature and filtered through celite bed. The filtrate was concentrated and the residue was dissolved in ethyl acetate (500 mL), washed with water (400 mL) and brine (300 mL). The combined organic layer was dried over sodium sulphate, filtered and concentrated to get 136 g of crude product 1-(2-methoxycarbonylphenyl)-4,4,5,5-tetramethyl-1,3,2-dioxaborolane as black gummy solid. The crude product was purified by column chromatography (silica gel 60-120 mesh) using 2% EtOAc in hexane as eluent to afford 109 g (85%) of 1-(2-methoxycarbonylphenyl)-4,4,5,5-tetramethyl-1,3,2-dioxaborolane as off-white solid.

$^1$H NMR (300 MHz, CDCl$_3$): δ [ppm] 1.27 (s, 6H), 1.43 (s, 6H), 3.92 (s, 3H), 7.39-7.45 (m, 1H), 7.49-7.53 (m, 2H), 7.94 (dd, J=0.87, 7.71 Hz, 1H).

Synthesis of methyl 2'-hexadecoylbiphenyl-2-carboxylate

A 5 L 3-necked round-bottomed flask, equipped with overhead stirrer, nitrogen inlet, condenser and exhaust. A solution of 1-(2'-bromophenyl)hexadecan-1-one (185 g, 0.4667 mol) in toluene (1800 mL) was added 1-(2-methoxycarbonylphenyl)-4,4,5,5-tetramethyl-1,3,2-dioxaborolane (171.1 g, 0.6533 mol) followed by aqueous K$_2$CO$_3$ (1.68 mol, 3.6 eq) in water (600 mL) at room temperature. N$_2$ gas was bubbled into the solution for 90 min. Pd(PPh$_3$)$_4$ (21.56 g, 0.0186 mol) was added to the mixture then N$_2$ gas was bubbled into the solution for another 45 min. The reaction mixture was stirred at 120° C. for 16 h. Reaction mixture was cooled to room temperature, then quenched with ice and extracted with ethyl acetate (750 mL). The organic layer was washed with water (1000 mL), brine solution (750 mL), dried over sodium sulphate and concentrated under vacuum to obtain 210 g of product as crude product. The crude compound was purified by column chromatography (silica gel, 230-400 mesh) using 0.2% ethyl acetate in hexane as eluent to afford 153 g (73%) of the product methyl 2'-hexadecoylbiphenyl-2-carboxylate.

$^1$H NMR (300 MHz, CDCl$_3$): δ [ppm] 0.89 (t, J=6.99 Hz, 3H), 1.18-1.39 (m, 24H), 1.42-1.51 (m, 2H), 2.45-2.54 (m, 2H), 3.65 (s, 3H), 7.16-7.22 (m, 2H), 7.41-7.58 (m, 4H), 7.65 (dd, J=1.77, 7.41 Hz, 1H), 7.98 (dd, J=1.41, 7.78 Hz, 1H).

Stage 3: 6-Tetradecyldibenzo[a,c]cycloheptane-5,7-dione

A 3 L 4-necked round-bottomed flask, equipped with a mechanical overhead stirrer, condenser, nitrogen inlet and exhaust. A solution of methyl 2'-hexadecoylbiphenyl-2-carboxylate (81 g, 0.18 mol) in anhydrous toluene (810 mL) was treated with sodium hydride (60% dispersion in mineral oil, 12.69 g, 0.54 mol, 3 eq) in four equal portions. The white suspension was heated to an external temperature of 110° C. for 16 h. The reaction mixture was allowed to cool to room temperature followed by further cooling in an ice/water bath to allow quenching by drop wise addition of 2M hydrochloric acid in ether (300 mL) over 30 min. The precipitated acidic reaction mixture was filtered and the recovered solid washed with toluene (200 mL). The filtrate was concentrated to give yellow oil (78 g), which was used without further purification.

$^1$H NMR (400 MHz, CDCl$_3$): δ [ppm] 0.89 (t, J=7.40 Hz, 3H), 1.15-1.42 (m, 24H), 1.95-2.01 (m, 2H), 3.86 (t, J=6.92 Hz, 1H), 7.44-7.56 (m, 6H), 7.59-7.62 (m, 2H).

Stage 4: 6-Tetradecyldibenzo[a,c]cycloheptane

A 3 L 4-necked round-bottomed flask, equipped with a mechanical overhead stirrer, condenser, nitrogen inlet and exhaust. A solution of 6-tetradecyldibenzo[a,c]cycloheptane-5,7-dione (140 g, 0.3349 mol) in trifluoroacetic acid (1862 mL) and hexane (244 mL) was allowed to stir at ambient temperature under a blanket of nitrogen. Triethylsilane (233.1 g, 2.0095 mol) was added drop wise to the solution over an hour. The resulting cloudy yellow solution was allowed to stir at ambient temperature overnight for 16 h. Reaction mixture was quenched with water (1 L) and diluted with hexane (500 mL). The organic layer was stirred vigorously with 10% (w/v) potassium phosphate solution (500 mL) for 2 h. The organic layer was separated, dried over sodium sulphate and concentrated under vacuum to obtain 148 g of crude product. The crude compound was purified by column chromatography (silica gel, 230-400 mesh) using 0.1% ethyl acetate in hexane as eluent to afford 92 g (71%) of 6-tetradecyldibenzo[a,c]cycloheptane.

$^1$H NMR (400 MHz, CDCl$_3$): δ [ppm] 0.92 (t, J=6.18 Hz, 3H), 1.21-1.49 (m, 26H), 2.16-2.24 (m, 2H), 2.32-2.41 (m, 1H), 2.55-2.61 (m, 2H), 7.22 (d, J=6.72 Hz, 2H), 7.25-7.45 (m, 6H).

Stage 5: 3,9-Dibromo-6-tetradecyldibenzo[a,c]cycloheptane

A 2 L 3-necked round-bottomed flask, equipped with a mechanical overhead stirrer, nitrogen inlet and exhaust. A solution of 6-tetradecyldibenzo[a,c]cycloheptane (32 g, 0.082 mol) in chloroform (250 mL) was treated with anhydrous zinc chloride (1M solution in ether) (20.5 mL, 0.021 mol, 0.25 eq) and the mixture was cooled to −8° C. The flask was wrapped in aluminium foil to prevent exposure to light. A solution of bromine (14.1 g, 0.177 mol, 2.16 eq) in chloroform (70 mL) was added drop wise over 2 h, then the reaction mixture was left to stir for 48 h. The reaction monitoring by GCMS showed 11.79% of dibromo isomer and 73.64% of the corresponding monobromide. Further addition of anhydrous zinc chloride (2.05 mL, 0.025 eq) and bromine (1.41 g 0.216 eq) in chloroform (30 mL) and allowed to stir for 64 h, reaction monitoring by GCMS showed 19.10% of dibromide isomer. Further addition of anhydrous zinc chloride (2.05 mL, 0.025 eq) and bromine (1.41 g 0.216 eq) in chloroform (30 mL) and allowed to stir for 48 h, reaction monitoring by GCMS showed 41.87% of dibromide isomer. Further addition of anhydrous zinc chloride (2.05 mL, 0.025 eq) and bromine (1.41 g 0.216 eq) in chloroform (30 mL) and allowed to stir for 48 h, reaction monitoring by GCMS showed 65.51% of dibromide isomer. Further addition of anhydrous zinc chloride (2.05 mL, 0.025 eq) and bromine (1.41 g 0.216 eq) in chloroform (30 mL) and allowed to stir for 64 h, reaction monitoring by GCMS showed 71.62% of dibromide isomer. The cooled reaction mixture was quenched with 20% (w/v) aqueous sodium thiosulphate solution (500 mL). The recovered organic layer was washed with 20% (w/v) aqueous sodium thiosulphate solution (700 mL) followed by water (750 mL). The organic layer was dried over sodium sulphate and concentrated under vacuum to get 40 g of 3,9-dibromo-6-tetradecyldibenzo[a,c]cycloheptane as crude material. The crude compound was purified by column chromatography (silica gel, 230-400 mesh) using 100% hexanes as eluent to afford 35 g (77.9%) of 3,9-dibromo-6-tetradecyldibenzo[a,c]cycloheptane.

Monomer Example 2

A 2 L three-necked round-bottom flask, equipped with a mechanical overhead stirrer, condenser, nitrogen inlet and exhaust. 3,9-Dibromo-6-tetradecyldibenzo[a,c]cycloheptane (37 g, 0.067 mol), bis(pinacolato)diborane (37.7 g, 0.148 mol) and KOAc (37.3 g, 0.404 mol) were taken in dioxane and N$_2$ gas was purged through the mixture for 30 minutes. PdCl$_2$ (dppf) complex (0.88 g, 0.001 mol) was added followed by dppf (0.59 g, 0.001 mol), N$_2$ gas was purged through the mixture for another 45 minutes. The reaction mixture was heated to 120° C. and stirred for 16 h. The reaction mixture was cooled to room temperature and filtered through celite bed. The filtrate was concentrated and the residue was dissolved in ethyl acetate (500 mL), washed with water (400 mL) and brine (300 mL). The combined organic layer was dried over sodium sulphate, filtered and concentrated to get 49 g of Monomer Example 2 with 51.5% HPLC purity. The crude compound was purified by column chromatography (silica gel, 230-400 mesh) using 100% dichloromethane as eluent to afford of Monomer Example 2 (35 g) with 57.12% HPLC purity. The above compound was triturated by stirring in acetonitrile (400 mL) for 16 h to get 27 g of Monomer Example 2 with 81.05% HPLC purity. It was dissolved in toluene (30 mL) at 100° C. followed by the addition of acetonitrile (300 mL) and stirring overnight gave a solid that was filtered and dried in air. This procedure was followed repeatedly (4 times) to get 20 g (46%) of Monomer Example 2 with 99.6% HPLC purity.

$^1$H NMR (400 MHz, CDCl$_3$): δ [ppm] δ 0.88 (t, J=8.48 Hz, 3H), 1.23-1.31 (m, 24H), 1.37-1.48 (m, 2H), 1.38 (s, 24H), 2.13-2.26 (m, 2H), 2.31-2.40 (m, 1H), 2.61 (dd, J=6.16, 12.72 Hz, 2H), 7.43 (d, J=7.56 Hz, 2H), 7.67 (s, 2H), 7.80 (d, J=7.52 Hz, 2H).

$^{13}$C NMR (100 MHz, CDCl$_3$): δ [ppm] 14.15, 22.71, 24.90, 27.40, 29.39, 29.69, 29.73, 31.95, 34.60, 44.76, 83.78, 127.55, 133.15, 135.42, 143.84.

Polymer Example 1

A polymer was prepared by Suzuki polymerisation as described in WO 00/53656 of the following monomers:

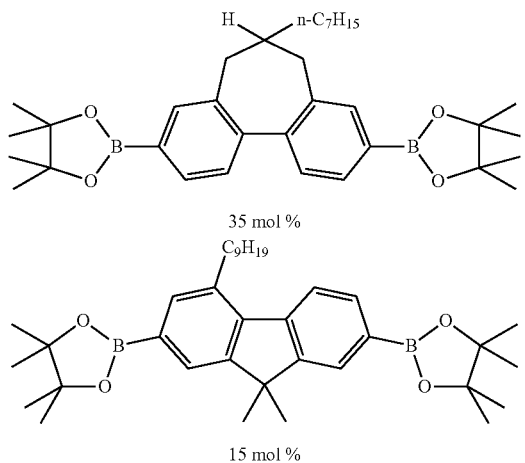

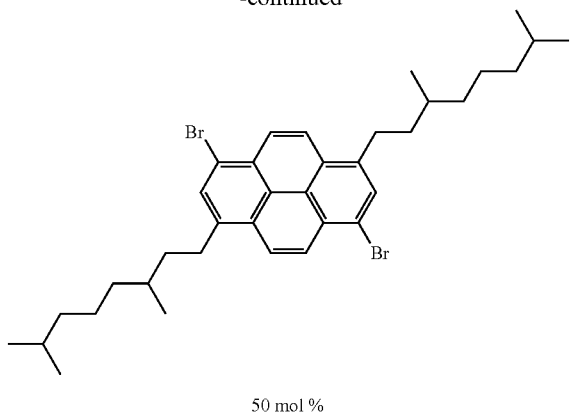

50 mol %

Comparative Polymer 1

For the purpose of comparison, a polymer was prepared as described for Polymer Example 1 except that Monomer Example 1 was replaced with more fluorene monomer.

50 mol %

50 mol %

Polymer Example 2

A polymer was prepared by Suzuki polymerisation as described in WO 00/53656 of the following monomers:

35 mol %

15 mol %

50 mol %

Device Example 1

A blue organic light-emitting device having the following structure was prepared:

ITO/HIL (35 nm)/HTL (22 nm)/LE (65 nm)/Cathode, wherein ITO is an indium-tin oxide anode; HIL is a hole-injecting layer; HTL is a hole-transporting layer; LE is a light-emitting layer; and the cathode comprises a layer of metal fluoride in contact with the light-emitting layer and a layer of silver and a layer of aluminium.

To form the device, a substrate carrying ITO was cleaned using UV/Ozone. The hole injection layer was formed by spin-coating an aqueous formulation of a hole-injection material available from Plextronics, Inc. The hole transporting layer was formed to a thickness of 21 nm by spin-coating Hole-Transporting Polymer 1 and crosslinking the polymer by heating. The light-emitting layer was formed by spin-coating a mixture of Light-Emitting Polymer 1 and Polymer Example 1 (please provide the weight ratio). The cathode was formed by evaporation of a first layer of a metal fluoride to a thickness of about 2 nm, a second layer of aluminium to a thickness of about 100 nm and a third layer of silver to a thickness of about 100 nm.

Hole Transporting Polymer 1 was formed by Suzuki polymerisation as described in WO 00/53656 of the following monomers:

50 mol %

-continued

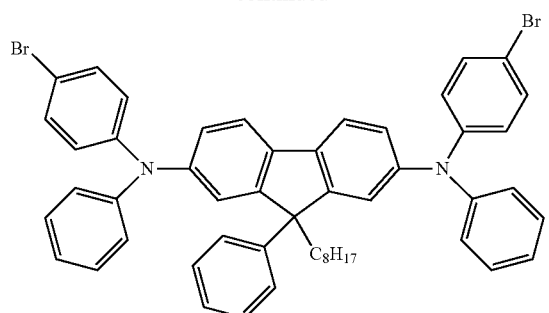

40 mol %

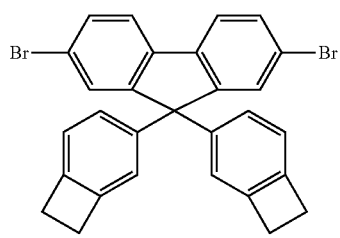

5 mol %

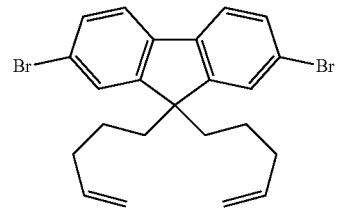

5 mol %

Light-Emitting Polymer 1 was formed by Suzuki polymerisation as described in WO 00/53656 of the following monomers:

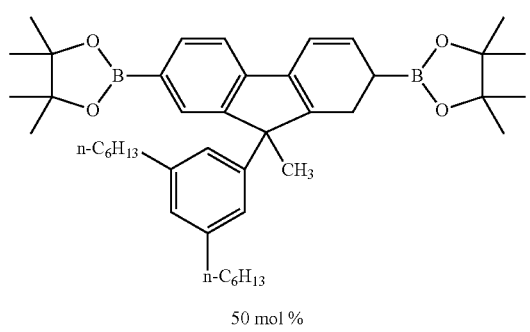

50 mol %

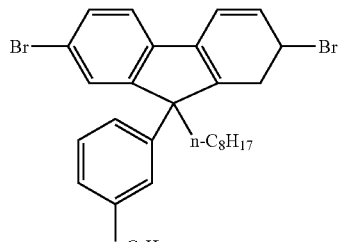

18 mol %

-continued

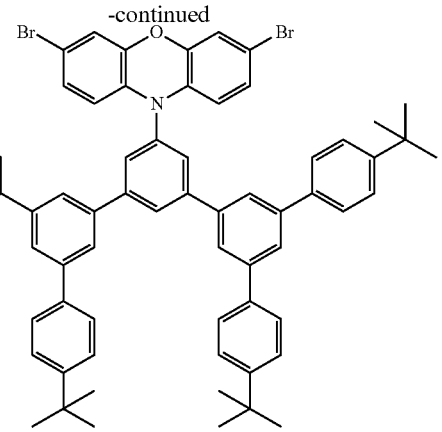

3 mol %

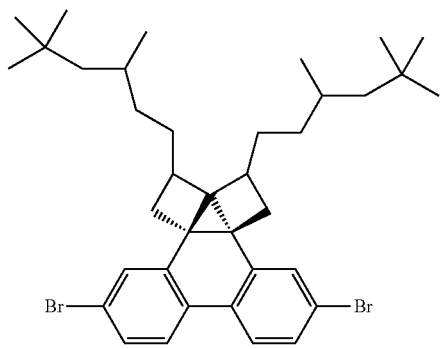

25 mol %

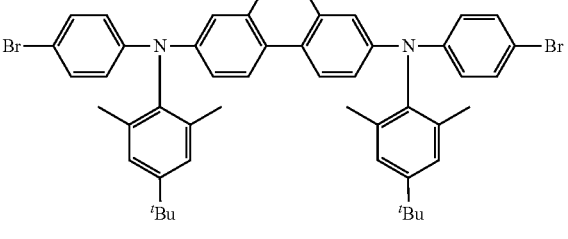

4 mol %

Comparative Device 1

A device was prepared as described in Device Example 1 except that Comparative Polymer 1 was used in place of Polymer Example 1.

Figure 4:
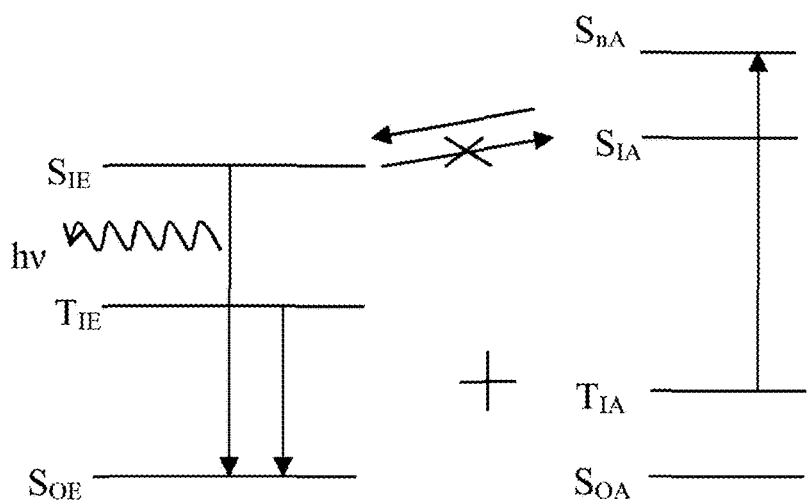
FIG. 4 is a schematic illustration of a second triplet-triplet annihilation mechanism.
Figure 5:
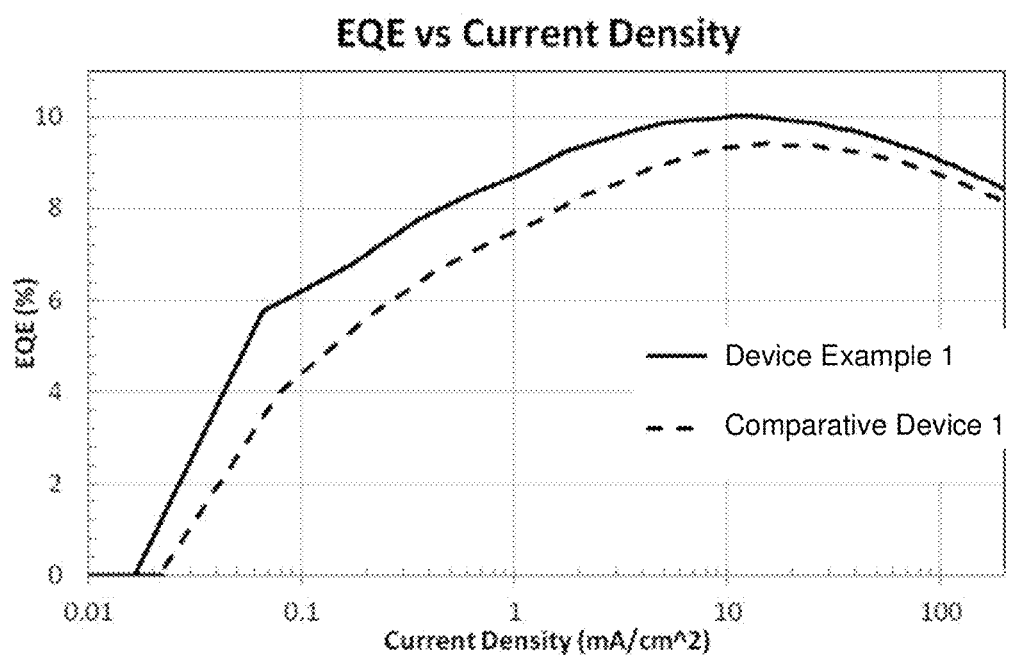
FIG. 5 is a graph of efficiency vs. voltage for a device according to an embodiment of the invention and a comparative device.

With reference to FIG. 4, the efficiency of Device Example 1 is higher than that of Comparative Device 1. Without wishing to be bound by any theory, it is believed that the repeat unit of formula (I) in Polymer Example 1 creates a twist along the polymer backbone that may reduce diffusion of triplet excitons as compared to Comparative Polymer 1. By confining triplet excitons in this way, the probability of TTA may be greater than for a material allowing greater diffusion of triplet excitons, which may increase the probability of triplet quenching rather than triplet-triplet annihilation.

With reference to Table 1, Device Example 1 produces blue light with a lower CIE y value (deeper blue colour) than Comparative Device 1. Without wishing to be bound by any theory, it is believed that this bluer colour is due to the reduced extent of conjugation of Polymer Example 1.

TABLE 1

| Device | CIE x | CIE y |
| --- | --- | --- |
| Device Example 1 | 0.138 | 0.122 |
| Comparative Device 1 | 0.137 | 0.134 |

Device Examples 2 and 3

Blue organic light-emitting devices were prepared as described with reference to Device Example 1 except that the hole-transporting polymer was formed by spin-coating Hole-Transporting Polymer 2, and the light-emitting layer was formed by spin-coating a mixture of Light-Emitting Polymer 1 and either Polymer Example 1 (Device Example 2) or Polymer Example 2 (Device Example 3).

Hole Transporting Polymer 2 was formed by Suzuki polymerisation as described in WO 00/53656 of the following monomers:

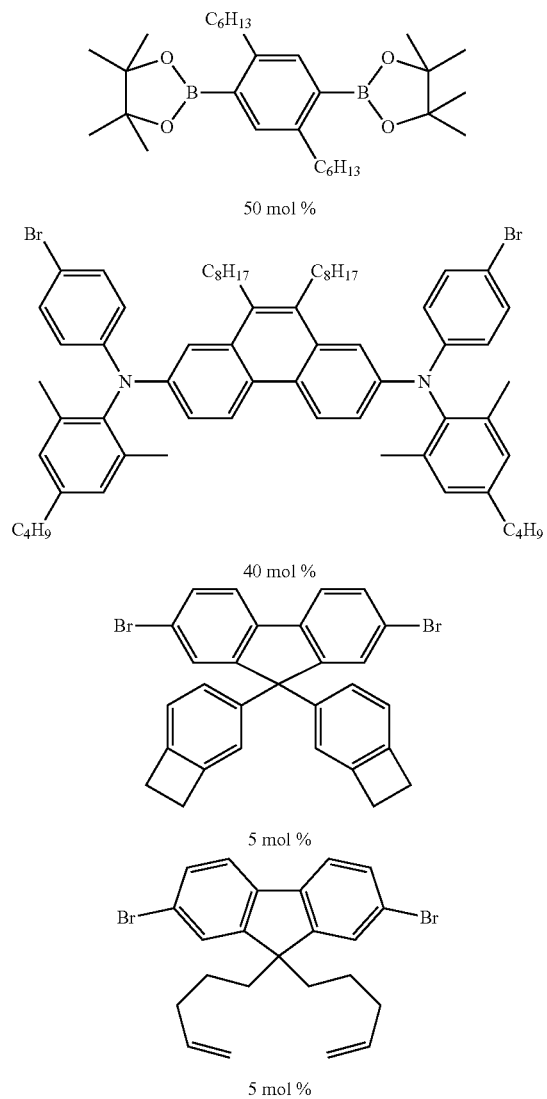

The lifetime and the efficiency of Device Example 2 are very similar to those of Device Example 3.

CIE coordinates were measured using a Minolta CS200 Chromameter. With reference to Table 2, Device Example 3 produces blue light with a lower CIE y value (deeper blue colour) than Device Example 2. The repeat unit of formula (I) in Polymer Example 2 contains a longer alkyl chain ($A=CH(n-C_{14}H_{29})$) as compared to the repeat unit of formula (I) in Polymer Example 1 ($A=CH(n-C_7H_{15})$).

TABLE 2

| Device | CIE x | CIE y |
| --- | --- | --- |
| Device Example 2 | 0.137 | 0.124 |
| Device Example 3 | 0.137 | 0.120 |

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A light-emitting composition comprising a mixture of a fluorescent light-emitting material and a triplet-accepting copolymer wherein the triplet-accepting copolymer has a lowest triplet excited state energy level that is lower than a lowest triplet excited state energy level of the fluorescent light-emitting material, the triplet accepting copolymer comprising a triplet-accepting repeat unit, a repeat unit of formula (I), and one or more further co-repeat units;

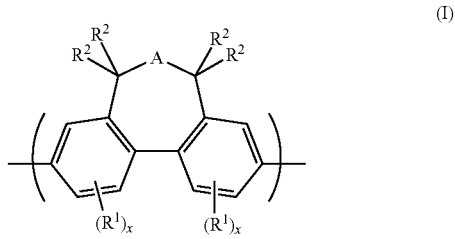

wherein A is a divalent group of formula $-CR^2_2-$; $R^1$ independently in each occurrence is a $C_{1-40}$ hydrocarbyl group;

$R^2$ in each occurrence is H; a $C_{1-40}$ hydrocarbyl group; or a $C_{1-20}$ alkyl, wherein one or more non-adjacent C atoms of the $C_{1-20}$ alkyl are replaced by an aryl or heteroaryl group, O, S, C=O, COO, or $NR^{11}$, wherein $R^{11}$ is a $C_{1-10}$ alkyl; and x independently in each occurrence is 0, 1, 2 or 3;

wherein the copolymer comprises 10-40 mol % of repeat units of formula (I); and wherein light emission from the composition has a peak wavelength that is the same as or no more than 10 nm longer than a peak wavelength of light emitted from the fluorescent light-emitting material alone wherein the copolymer comprises 5-40 mol % of the further co-repeat units and the further co-repeat units are phenylene, fluorine, or dihydrophenthrene repeat units, each of which is unsubstituted or substituted with one or more substituents.

2. A light-emitting composition according to claim 1, wherein each $R^2$ is independently selected from the group consisting of H and $C_{1-20}$ alkyl.

3. A light-emitting composition according to claim 1 wherein the triplet-accepting repeat unit comprises a polycyclic aromatic co-repeat unit that may be unsubstituted or substituted with one or more substituents.

4. A light-emitting composition according to claim 3 wherein the triplet-accepting repeat unit is selected from anthracene and pyrene, each of which may be unsubstituted or substituted with one or more substituents.

5. A light-emitting composition according to claim 4 wherein the triplet-accepting repeat unit is selected from repeat units of formulae (II) and (III):

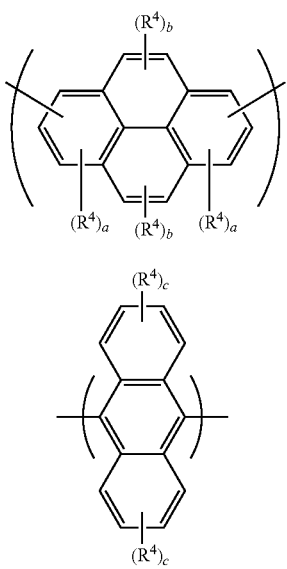

wherein $R^4$ in each occurrence is independently a $C_{1-40}$ hydrocarbyl group or a $C_{1-20}$ alkyl, wherein one or more non-adjacent C atoms of the $C_{1-20}$ alkyl are replaced by O, S, C=O, COO or $NR^{11}$, wherein $R^{11}$ is a $C_{1-20}$ alkyl group; each a is independently 0, 1 or 2; each b is independently 0, 1 or 2; and each c is independently 0, 1, 2, 3 or 4.

6. A light-emitting composition according to claim 5 wherein the repeat unit of formula (II) has formula (IIa):

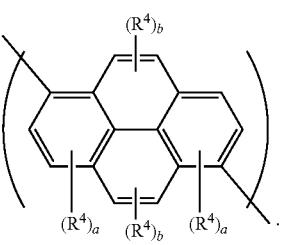

7. A light-emitting composition according to claim 5 or 6 wherein at least one a and/or at least one b is at least 1.

8. A light-emitting composition according to claim 1 wherein the fluorescent light-emitting material is a polymer.

9. A light-emitting composition according to claim 8 wherein the fluorescent light-emitting polymer comprises repeat units of formula (IX):

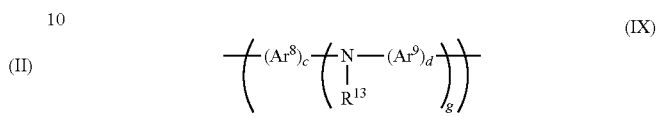

wherein $Ar^8$ and $Ar^9$ in each occurrence are independently substituted or unsubstituted aryl or heteroaryl, g is greater than or equal to 1, $R^{13}$ is H, alkyl, $Ar^{10}$, a branched or linear chain of $Ar^{10}$ groups, or a crosslinkable unit that is bound directly to the N atom of formula (IX) or spaced apart therefrom by a spacer group, wherein $Ar^{10}$ in each occurrence is independently optionally substituted aryl or heteroaryl, and c and d are each independently 1, 2, or 3; and any two of $Ar^8$, $Ar^9$ and $R^{13}$ directly bound to the same N atom may be linked by a direct bond or a divalent linking group to form a ring.

10. A light-emitting composition according to claim 8 or 9 wherein the fluorescent light-emitting polymer comprises one or more co-repeat units selected from phenylene, fluorene and dihydrophenanthrene repeat units, each of which may be unsubstituted or substituted with one or more $C_{1-40}$ hydrocarbyl groups.

11. A light-emitting composition according to claim 1 wherein the fluorescent light-emitting material:triplet-accepting polymer weight ratio is in the range of about 99.5:0.5 to about 70:30.

12. A light-emitting composition consisting essentially of a fluorescent light-emitting material and a triplet-accepting polymer according to claim 1.

13. A formulation comprising a composition according to claim 1 and at least one solvent.

14. An organic light-emitting device comprising an anode, a cathode and a light-emitting layer between the anode and the cathode wherein the light-emitting layer comprises a composition according to claim 1.

15. A method of forming an organic light-emitting device according to claim 14, the method comprising the steps of forming the light-emitting layer over one of the anode and cathode, and forming the other of the anode and cathode over the light-emitting layer.

16. A method according to claim 15 wherein the light-emitting layer is formed by depositing the formulation of claim 13 over one of the anode and cathode and evaporating the at least one solvent.

* * * * *